(12) United States Patent
Nakano et al.

(10) Patent No.: US 12,476,163 B2
(45) Date of Patent: Nov. 18, 2025

(54) SEMICONDUCTOR DEVICE AND SEMICONDUCTOR MODULE

(71) Applicant: DENSO CORPORATION, Kariya (JP)

(72) Inventors: Takahiro Nakano, Kariya (JP); Seigo Oosawa, Kariya (JP); Yasushi Ookura, Kariya (JP); Naohito Mizuno, Kariya (JP); Yoshihiro Inutsuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 515 days.

(21) Appl. No.: 17/964,381

(22) Filed: Oct. 12, 2022

(65) Prior Publication Data

US 2023/0032353 A1 Feb. 2, 2023

Related U.S. Application Data

(63) Continuation of application No. PCT/JP2021/011411, filed on Mar. 19, 2021.

(30) Foreign Application Priority Data

Apr. 17, 2020 (JP) .................................. 2020-074422
Feb. 25, 2021 (JP) .................................. 2021-028963

(51) Int. Cl.
  *H01L 23/367* (2006.01)
  *H01L 21/48* (2006.01)
  (Continued)

(52) U.S. Cl.
  CPC ........ *H01L 23/367* (2013.01); *H01L 21/4853* (2013.01); *H01L 21/4871* (2013.01);
  (Continued)

(58) Field of Classification Search
  CPC ............... H01L 23/367; H01L 23/3121; H01L 23/5386; H01L 23/3107; H01L 23/3135; H01L 23/3142; H01L 23/49562; H01L 23/4334; H01L 21/4853; H01L 21/4871; H01L 21/565; H01L 21/568; H01L 21/6835; H01L 24/19; H01L 24/20; H01L 2221/68372; H01L 2224/214; H01L 2224/96; H01L 2224/04105;
  (Continued)

(56) References Cited

U.S. PATENT DOCUMENTS

| | | |
|---|---|---|
| 5,604,376 A | 2/1997 | Hamburgen et al. |
| 5,776,800 A | 7/1998 | Hamburgen et al. |

(Continued)

FOREIGN PATENT DOCUMENTS

| | | |
|---|---|---|
| JP | H06-302727 A | 10/1994 |
| JP | 2002-016196 A | 1/2002 |

(Continued)

*Primary Examiner* — Marlon T Fletcher
*Assistant Examiner* — Christina A Sylvia
(74) *Attorney, Agent, or Firm* — Posz Law Group, PLC

(57) ABSTRACT

A semiconductor device includes a semiconductor element, a sealing member, and a rewiring layer. The rewiring layer includes an insulating layer covering a front surface of the semiconductor element and a part of the sealing member, an electrode connected to the semiconductor element, and an externally-exposed layer being conductive and covering a portion of the electrode exposed from the insulating layer.

4 Claims, 22 Drawing Sheets

(51) Int. Cl.
  *H01L 21/56* (2006.01)
  *H01L 21/683* (2006.01)
  *H01L 23/00* (2006.01)
  *H01L 23/31* (2006.01)
  *H01L 23/538* (2006.01)
(52) U.S. Cl.
  CPC .......... *H01L 21/565* (2013.01); *H01L 21/568* (2013.01); *H01L 21/6835* (2013.01); *H01L 23/3121* (2013.01); *H01L 23/5386* (2013.01); *H01L 24/19* (2013.01); *H01L 24/20* (2013.01); *H01L 2221/68372* (2013.01); *H01L 2224/214* (2013.01)
(58) Field of Classification Search
  CPC ... H01L 2224/0603; H01L 2224/32245; H01L 2224/73267; H01L 2224/92244; H01L 2224/15153; H01L 2924/10156; H01L 2924/10158; H01L 2924/15153; H01L 2924/1815; H01L 2924/18162
  See application file for complete search history.

(56) References Cited

U.S. PATENT DOCUMENTS

| | | | |
|---|---|---|---|
| 6,271,469 B1 | 8/2001 | Ma et al. | |
| 6,306,680 B1 * | 10/2001 | Fillion | H01L 24/96 257/E23.125 |
| 6,703,707 B1 * | 3/2004 | Mamitsu | H01L 23/4334 257/713 |
| 2003/0022464 A1 | 1/2003 | Hirano et al. | |
| 2003/0132530 A1 | 7/2003 | Teshima et al. | |
| 2004/0070060 A1 | 4/2004 | Mamitsu et al. | |
| 2004/0070072 A1 | 4/2004 | Mamitsu et al. | |
| 2004/0089925 A1 | 5/2004 | Fukuda et al. | |
| 2004/0089940 A1 | 5/2004 | Mamitsu et al. | |
| 2004/0089941 A1 | 5/2004 | Mamitsu et al. | |
| 2004/0089942 A1 | 5/2004 | Mamitsu et al. | |
| 2004/0097082 A1 | 5/2004 | Mamitsu et al. | |
| 2005/0167821 A1 | 8/2005 | Mamitsu et al. | |
| 2016/0343630 A1 | 11/2016 | Kadoguchi et al. | |
| 2021/0305166 A1 * | 9/2021 | Moxey | H01L 23/49568 |
| 2022/0005743 A1 * | 1/2022 | Osawa | H01L 23/367 |
| 2022/0415748 A1 * | 12/2022 | Tanaka | H01L 23/053 |
| 2023/0163054 A1 * | 5/2023 | Oosawa | H01L 24/48 257/675 |

FOREIGN PATENT DOCUMENTS

| | | |
|---|---|---|
| JP | 2012-243890 A | 12/2012 |
| JP | 2014-013931 A | 1/2014 |
| JP | 2014-110383 A | 6/2014 |
| JP | 2020-047696 A | 3/2020 |

* cited by examiner

SEMICONDUCTOR DEVICE AND SEMICONDUCTOR MODULE

CROSS REFERENCE TO RELATED APPLICATIONS

The present application is a continuation application of International Patent Application No. PCT/JP2021/011411 filed on Mar. 19, 2021, which designated the U.S. and claims the benefit of priority from Japanese Patent Application No. 2020-074422 filed on Apr. 17, 2020 and Japanese Patent Application No. 2021-028963 filed on Feb. 25, 2021. The entire disclosures of all of the above applications are incorporated herein by reference.

TECHNICAL FIELD

The present disclosure relates to a semiconductor device having a fan-out package structure, and a semiconductor module including the semiconductor device.

BACKGROUND

Conventionally, there has been known a semiconductor device including a semiconductor element, and a semiconductor module having a double-sided heat dissipation structure including the semiconductor device.

SUMMARY

The present disclosure provides a semiconductor device including a semiconductor element, a sealing member, and a rewiring layer. The rewiring layer includes an insulating layer covering a front surface of the semiconductor element and a part of the sealing member, an electrode connected to the semiconductor element, and an externally-exposed layer being conductive and covering a portion of the electrode exposed from the insulating layer. The present disclosure also provides a semiconductor module including the semiconductor device.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
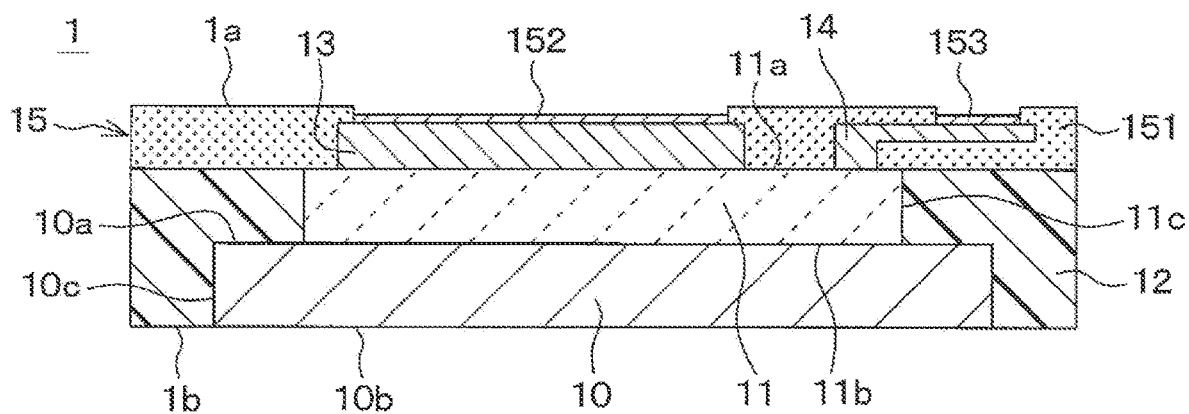
FIG. 1 is a cross-sectional view illustrating a configuration of a semiconductor device according to a first embodiment.

A semiconductor module according to a related art includes a semiconductor device having a semiconductor element, two heat sinks disposed on either side of the semiconductor device, a lead terminal, and a wire connecting the lead terminal to the semiconductor device. In order to avoid short-circuiting due to contact between the wire and the heat sinks, the semiconductor module is configured such that a heat dissipation block formed of a material having high thermal conductivity is disposed between wire-connected surfaces of the semiconductor device and the heat sinks facing such surfaces.

However, the above semiconductor module is configured to avoid contact between the wire and the heat sinks by disposing the heat dissipation block so as to provide a clearance of not less than a predetermined dimension between the semiconductor device and the heat sinks. Therefore, the heat dissipation block is an obstacle to thinning of the semiconductor module. Further, since the heat dissipation block is disposed between the semiconductor device and the heat sinks, thermal resistance increases accordingly due to the heat dissipation block. This reduces the heat dissipation of the semiconductor module.

In view of the above circumstances, the inventors of the present disclosure diligently examined a semiconductor device structure and a semiconductor module structure for the purpose of thinning and increasing the heat dissipation of a semiconductor module of the above-mentioned type. As a result, the inventors of the present disclosure devised a semiconductor module that is configured so as to permit a semiconductor device to have a fan-out package structure in which a rewiring layer is formed, join a heat sink to both surfaces of the semiconductor device without via a heat dissipation block, and connect a lead terminal to the rewiring layer without via a wire. The resulting semiconductor module has a double-sided heat dissipation structure in which the semiconductor module is thinned and provided with high heat dissipation without via a heat dissipation block or a wire.

In the above instance, the semiconductor device having the fan-out package structure including a semiconductor element needs to be configured so as to expose a rear surface opposite a front surface of a semiconductor element covered with the rewiring layer. The semiconductor device of this type is manufactured, for example, by closely fixing the front surface of a power semiconductor element to a temporary fixing material, covering the rear surface of the power semiconductor element with a sealing member, peeling the power semiconductor element from the temporary fixing material, forming the rewiring layer on the front surface, grinding the sealing member as needed to expose the rear surface, and forming an electrode on the rear surface.

However, the use of the above manufacturing method increases the number of processes and the cost of manufacturing. Further, diligent examinations conducted by the inventors of the present disclosure have revealed that the sealing member may peel from a side surface of the semiconductor element during a grinding process of making the rear surface exposed from the sealing member. In the event of such peeling, the progress of the peeling may damage the rewiring layer and may allow moisture to enter through a gap between the sealing member and the side surface of the semiconductor element. This degrades the reliability of the semiconductor device.

A semiconductor device according to a first aspect of the present disclosure includes a semiconductor element, a conductive member, a sealing member, and a rewiring member. The semiconductor element has a front surface, a rear surface positioned opposite the front surface, and a side surface connecting the front surface and the rear surface. The conductive member has an upper surface that is joined to the rear surface of the semiconductor element and a lower surface that is opposite the upper surface. The sealing member covers the side surface of the semiconductor element and a part of the conductive member. The rewiring layer including an insulating layer, a first electrode, a second electrode, a first externally-exposed layer, and second externally-exposed layer. The insulating layer covers the front surface of the semiconductor element and a part of the sealing member. The first electrode and the second electrode are connected to the semiconductor element. The first externally-exposed layer is conductive and covers a portion of the first electrode that is exposed from the insulating layer. The second externally-exposed layer is conductive and covers a portion of the second electrode that is exposed from the insulating layer. An end of the second electrode that is positioned opposite the semiconductor element is extended to a portion of the rewiring layer that is positioned outside an outline of the semiconductor element. The second externally-exposed layer covers a portion of the second electrode that is positioned outside the outline of the semiconductor element. The lower surface of the conductive member is exposed from the sealing member.

In the semiconductor device according to the first aspect of the present disclosure, a boundary between the sealing member and the side surface of the semiconductor element is covered with the conductive member. This reduces force that is applied to the boundary during a grinding process of the sealing member, and the semiconductor device having the fan-out package structure can inhibit peeling at the boundary. Furthermore, since the conductive member covers the rear surface of the semiconductor element, a grinding tool does not reach the rear surface of the semiconductor element during sealing member grinding. Even if an electrode exists on the rear surface of the semiconductor element, the electrode will not be ground during sealing member grinding. Accordingly, this semiconductor device can be manufactured without having to perform a process of forming an electrode on the rear surface of the semiconductor element after grinding the sealing member. As a result, the semiconductor device is configured so as to reduce the manufacturing cost.

A semiconductor device according to a second aspect of the present disclosure includes a semiconductor element, a sealing member, and a rewiring layer. The semiconductor element has a front surface, a rear surface positioned opposite the front surface, and a side surface connecting the front surface and the rear surface. The sealing member covers the side surface of the semiconductor element. The rewiring layer includes an insulating layer, a first electrode, a second electrode, a first externally-exposed layer, and a second externally-exposed layer. The insulating layer covers the front surface of the semiconductor element and a part of the sealing member. The first electrode and the second electrode are connected to the semiconductor element. The first externally-exposed layer is conductive and covers a portion of the first electrode that is exposed from the insulating layer. The second externally-exposed layer is conductive and covers a portion of the second electrode that is exposed from the insulating layer. An end of the second electrode that is positioned opposite the semiconductor element is extended to a portion of the rewiring layer that is positioned outside an outline of the semiconductor element. The second externally-exposed layer covers a portion of the second electrode that is positioned outside the outline of the semiconductor element. The sealing member has one surface covered with the rewiring layer and an opposite surface positioned opposite the one surface. The opposite surface of the sealing member projects from the rear surface of the semiconductor element and has a recessed section that is recessed toward the one surface. A part or whole of the rear surface of the semiconductor element is exposed from the sealing member in the recessed section of the sealing member.

In the semiconductor device according to the second aspect of the present disclosure, since the opposite surface of the sealing member positioned opposite the one surface covered with the rewiring layer has a shape protruding from the rear surface of the semiconductor element, a force applied to a boundary between the sealing member and the side surface of the semiconductor element during grinding of the sealing member is reduced. Furthermore, since the opposite surface of the sealing member protrudes from the rear surface of the semiconductor element, even if an electrode exists on the rear surface of the semiconductor element, the electrode will not be ground during grinding of the sealing member. This eliminates the necessity of forming the electrode after grinding of the sealing member, and thus reduces the manufacturing cost. Consequently, this semiconductor device is configured so as to not only reduce the peeling that may occur at an interface between the sealing member and the side surface of the semiconductor element due to sealing member grinding more than before, but also decrease the manufacturing cost.

A semiconductor module according to a third aspect of the present disclosure includes a semiconductor device, a heat dissipation member, a lead frame, and a second sealing member. The semiconductor device includes a semiconductor element, a first sealing member, and a rewiring layer. The semiconductor element has a front surface, a rear surface positioned opposite the front surface, and a side surface connecting the front surface and the rear surface. The first sealing member covers the side surface of the semiconductor element. The rewiring layer includes an insulating layer, an electrode, and an externally-exposed layer. The insulating layer covers the front surface of the semiconductor element and a part of the first sealing member. The electrode is connected to the semiconductor element. The externally-exposed layer is conductive and covers a portion of the electrode that is exposed from the insulating layer. The heat dissipation member is joined, through a joining material, to a portion of the rear surface of the semiconductor element that is exposed from the first sealing member. The lead frame is electrically joined to the electrode through the externally-exposed layer or the joining material. The second sealing member covers the semiconductor device, a part of the heat dissipation member, and a part of the lead frame. The semiconductor device has a fan-out package structure in which an end of the electrode that is exposed from the insulating layer is extended to a position outside an outline of the semiconductor element. An opposite surface positioned opposite one surface of the first sealing member that is covered with the rewiring layer projects from the rear surface of the semiconductor element and has a recessed section recessed toward the one surface. A part or whole of the rear surface of the semiconductor element is exposed from the first sealing member at the recessed section of the first sealing member and joined to the heat dissipation member through the joining material.

In the semiconductor module according to the third aspect of the present disclosure, the opposite surface of the first sealing member positioned opposite the one surface covered with the rewiring layer has a shape protruding from the rear surface of the semiconductor element. Thus, the semiconductor module includes the semiconductor device that is configured so as to reduce the peeling of an interface between the sealing member and the side surface of the semiconductor element and can have a reliability. Furthermore, in the semiconductor device, the first sealing member has the recessed section, and the heat dissipation member is joined, through the joining material, to the rear surface of the semiconductor element exposed from the first sealing member in the recessed section. Therefore, the joining material has a thickness according to the depth of the recessed section. This provides an advantageous effect that the thickness of the joining material can be easily controlled.

Embodiments of the present disclosure will now be described with reference to the accompanying drawings. Identical or equivalent parts described in conjunction with the following embodiments are designated by the same reference signs.

First Embodiment

A semiconductor device 1 according to a first embodiment will now be described with reference to FIGS. 1 and 2.

Figure 2:
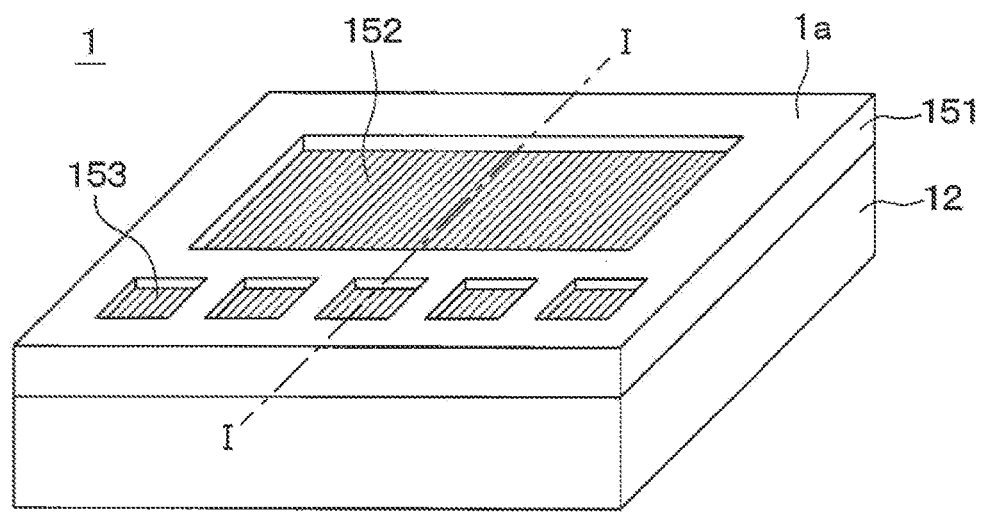
FIG. 2 is a perspective view illustrating the semiconductor device illustrated in FIG. 1 as viewed from a side close to a rewiring layer.

FIG. 1 is a cross-sectional view taken along line I-I of FIG. 2. In FIG. 2, which is not a cross-sectional view, a later-described first externally-exposed layer 152 and second externally-exposed layers 153 are hatched to facilitate the understanding of the first and second externally-exposed layers 152, 153.

[Configuration]

As shown, for example, in FIG. 1, the semiconductor device 1 according to the first embodiment includes a conductive member 10, a semiconductor element 11, a sealing member 12, and a rewiring layer 15. A first electrode 13 and second electrodes 14 are formed on the semiconductor element 11. The semiconductor device 1 is configured so that the semiconductor element 11 is mounted on the conductive member 10, which is larger in plane size than the semiconductor element 11, and that a side surface of the semiconductor element 11 is covered with the sealing member 12, and further that the rewiring layer 15 is formed on the semiconductor element 11 and the sealing member 12. The semiconductor device 1 has a fan-out package structure in which one end of the first electrode 13 is connected to an electrode pad (not shown) of the semiconductor element 11, one ends of the second electrodes 14 are connected to another electrode pad (not shown), and the other ends of the second electrodes 14 are extended to the outside of an outline of the semiconductor element 11. For simplicity of explanation, the fan-out package structure may be hereinafter referred to as the "FOP structure."

As shown, for example, in FIG. 1, the conductive member 10 covers a rear surface 11b of the semiconductor element 11. The rear surface 11b is opposite a front surface 11a of the semiconductor element 11 that is covered with the rewiring layer 15. The conductive member 10 is electrically connected to the rear surface 11b of the semiconductor element 11, and formed of an appropriate conductive material such as Cu (copper), sintered Ag (silver), or solder. In a case where the conductive member 10 is formed, for example, of solder, the conductive member 10 is directly joined to the rear surface 11b of the semiconductor element 11. Meanwhile, in a case where the conductive member 10 is formed, for example, by a Cu plate, the conductive member 10 is joined to the rear surface 11b of the semiconductor element 11 through an appropriate conductive joining material such as solder (not shown). The conductive member 10 has an upper surface 10a and a lower surface 10b, and functions as a rear surface electrode. The upper surface 10a faces, for example, the semiconductor element 11 and is connected to an electrode (not shown) formed on the rear surface 11b of the semiconductor element 11. The lower surface 10b, which is opposite the upper surface 10a, is exposed from the sealing member 12. Further, when formed of Cu or other material having high thermal conductivity, the conductive member 10 also functions to dissipate the heat of the semiconductor element 11 to the outside.

From the viewpoint of suppressing the warpage of the semiconductor element 11, it is preferable that the conductive member 10 be formed of a material having higher rigidity than the semiconductor element 11 and a joining material (not shown) used for joining to the semiconductor element 11.

In the present embodiment, the conductive member 10 is larger in plane size than the semiconductor element 11, and connected in such a manner that the rear surface 11b of the semiconductor element 11 is entirely positioned inside an outline of the conductive member 10. The reason is that the semiconductor element 11 has a side surface 11c for joining the front surface 11a to the rear surface 11b and has a structure in which the boundary between the side surface 11c of the semiconductor element 11 and the sealing member 12 is covered with the conductive member 10. The conductive member 10 is configured as described above in order to provide improved interfacial adhesion between the side surface 11c of the semiconductor element 11 and the sealing member 12 and thus enhance the reliability of the semiconductor device 1. Such improvement will be described in detail together with a later-described method for manufacturing the semiconductor device 1.

The semiconductor element 11 is mainly formed of a semiconductor material such as silicon or silicon carbide. For example, the semiconductor element 11 is a power semiconductor element such as a MOS transistor or an IGBT (insulated gate bipolar transistor), and manufactured by a common semiconductor process.

The semiconductor element 11 includes a plurality of electrode pads (not shown) that are formed, for example, of Al (aluminum) and mounted on the front surface 11a, and the first electrode 13 and the plurality of second electrodes 14, which are formed, for example, of Cu (copper) or other metal material, are placed on the electrode pads. The semiconductor element 11 is configured such that an electrode pad (not shown) and a third electrode (not shown) covering the electrode pad are formed on the rear surface 11b of the semiconductor element 11, and that the third electrode is connected to the outside through the conductive member 10. The first electrode 13 and the third electrode are formed, for example, as a pair and used as a main current path for the semiconductor element 11. At least one of the plurality of second electrodes 14 acts as a gate electrode, and is used to provide on/off control of a current between the first electrode 13 and the third electrode. The first electrode 13 is an inner layer electrode laminated over an electrode pad (not shown) and disposed inside the rewiring layer 15, and is connected to the first externally-exposed layer 152 as shown in FIG. 1. The plurality of second electrodes 14 are inner layer electrodes laminated over an electrode pad (not shown), as is the case with the first electrode 13, and are respectively connected to the second externally-exposed layers 153. Further, the second electrodes 14 each act as an internal wiring for connecting the second externally-exposed layers 153 in the rewiring layer 15 to an electrode pad (not shown) of the semiconductor element 11. The same also holds true for the first electrode 13. In a case where the first electrode 13 is referred to as the "first wiring" in the rewiring layer 15, the second electrodes 14 are each referred to as the "second wiring."

As shown in FIG. 1, the sealing member 12 is a member that covers the side surface 11c of the semiconductor element 11 and a part of the conductive member 10 excluding the lower surface 10b, and is formed of an appropriate resin material such as epoxy resin. More specifically, the sealing member 12 covers not only the upper surface 10a facing the semiconductor element 11 and a side surface 10c of the conductive member 10, but also the side surface 11c of the semiconductor element 11. A part of the sealing member 12 forms a rear surface 1b of the semiconductor device 1 together with the lower surface 10b of the conductive member 10.

As shown in FIG. 1, the rewiring layer 15 covers a surface including the front surface 11a of the semiconductor element 11 and a part of the sealing member 12, and has an insulating layer 151, the first externally-exposed layer 152, and the second externally-exposed layers 153 in addition to the first electrode 13 and the second electrodes 14. The rewiring layer 15 is formed, for example, by a publicly known rewiring formation technology.

The insulating layer 151 is, for example, made of an insulating material, such as polyimide, and formed by an appropriate coating process.

The first externally-exposed layer 152 and the second externally-exposed layers 153 are, for example, made of a metal material, such as Ni (nickel), and formed by electroless plating. When viewed from the top, the first externally-exposed layer 152 is formed inside the outline of the semiconductor element 11. Further, as shown in FIG. 2, the first externally-exposed layer 152 is partly exposed from the insulating layer 151 on the side toward a front surface 1a of the semiconductor device 1 so as to permit the first electrode 13 to be electrically connected from the outside. The second externally-exposed layers 153 cover a partial region of the second electrodes 14 that is positioned outside the outline of the semiconductor element 11. The number of second externally-exposed layers 153 formed is, for example, the same as the number of the second electrodes 14. Further, as shown in FIG. 2, the second externally-exposed layers 153 are exposed from the insulating layer 151 on the side toward the front surface 1a of the semiconductor device 1 so as to permit the semiconductor element 11 to be electrically connected from the outside through the second electrodes 14. The first and second externally-exposed layers 152, 153 may be any media for electrically connecting the semiconductor element 11 to other members, are not limited to a Ni or other plating layer, may be, for example, a solder bump, or may be formed by laminating a plating layer over a bump.

FIG. 2 indicates that five second externally-exposed layers 153 are formed to respectively cover a part of different second electrodes 14. However, the second externally-exposed layers 153 are not limited to such configuration. The number of second electrodes 14 and the number of second externally-exposed layers 153 are not specifically limited.

A basic configuration of the semiconductor device 1 according to the present embodiment is as described above. The semiconductor device 1 has the FOP structure in which the conductive member 10 is connected to the rear surface 11b of the semiconductor element 11 and is exposed instead of the semiconductor element 11. Therefore, the semiconductor device 1 is configured so that the interface between the side surface 11c of the semiconductor element 11 and the sealing member 12 is not exposed. This provides improved interfacial adhesion between the side surface 11c of the semiconductor element 11 and the sealing member 12.

[Manufacturing Method]

An example method for manufacturing the semiconductor device 1 will now be described with reference to FIGS. 3A to 3J.

Figure 3A:
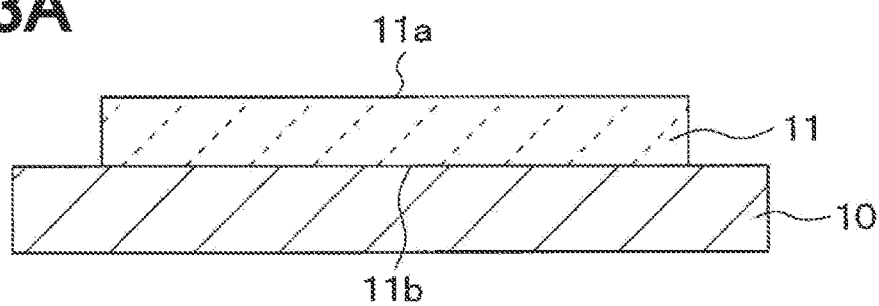
FIG. 3A is a cross-sectional view illustrating a part of a manufacturing process of the semiconductor device according to the first embodiment that is performed to join a conductive member to a semiconductor element.

First of all, the conductive member 10 and the semiconductor element 11, which is manufactured by a common semiconductor process and provided with an electrode pad (not shown) are prepared. The conductive member 10 is then joined to the rear surface 11b of the semiconductor element 11 by using, for example, solder as shown in FIG. 3A.

Figure 3B:
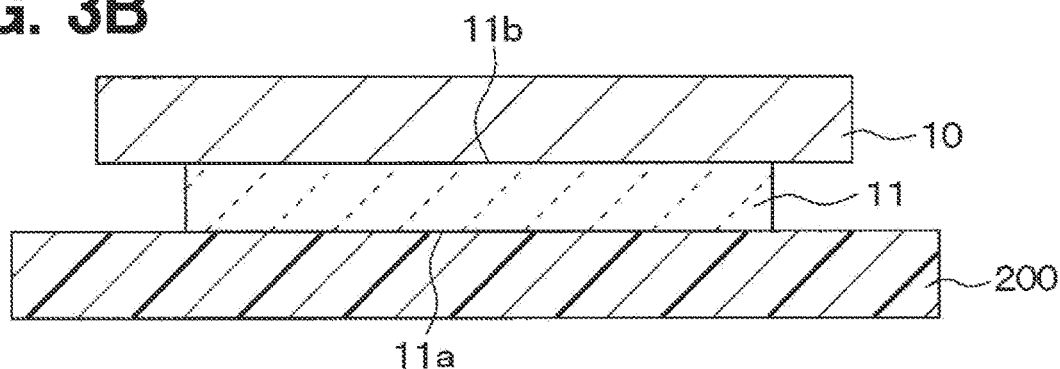
FIG. 3B is a cross-sectional view illustrating another part of the manufacturing process that is performed subsequently to the part illustrated in FIG. 3A.

Next, as shown in FIG. 3B, the front surface 11a of the semiconductor element 11 is pasted on a support substrate 200 to retain the semiconductor element 11 to which the conductive member 10 is joined. For example, an appropriate support substrate having a front surface provided with an adhesive sheet (not shown) highly adherent to silicon is used as the support substrate 200.

Figure 3C:
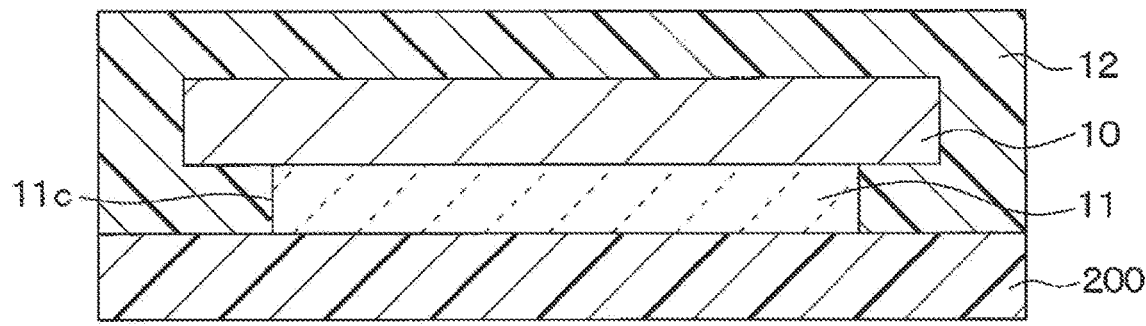
FIG. 3C is a cross-sectional view illustrating another part of the manufacturing process that is performed subsequently to the part illustrated in FIG. 3B.

Next, a mold (not shown) is prepared. Then, the semiconductor element 11 retained by the support substrate 200 is covered with a resin material, such as epoxy resin, by compression molding, and the resin material is hardened, for example, by heating to mold the sealing member 12 as shown in FIG. 3C. As a result, the side surface 11c of the semiconductor element 11 and the conductive member 10 are covered with the sealing member 12. Subsequently, the conductive member 10 and the semiconductor element 11, which are covered with the sealing member 12, are peeled from the support substrate 200.

Figure 3D:
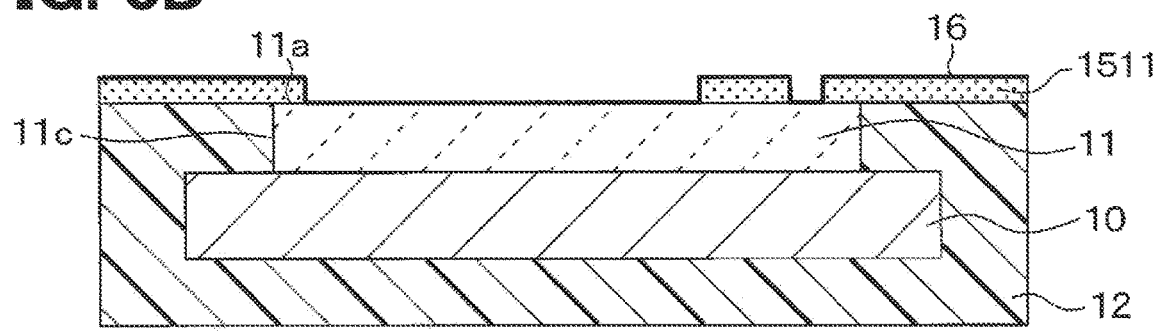
FIG. 3D is a cross-sectional view illustrating another part of the manufacturing process that is performed subsequently to the part illustrated in FIG. 3C.

Next, for example, a spin coating method is used to apply a solution including polyimide or other photosensitive material to the surface 11a of the semiconductor element 11 that is exposed from the sealing member 12, then the front surface 11a is dried as shown in FIG. 3D to form a first layer 1511 that is to be included in the insulating layer 151. The first layer 1511 is, for example, etched by a photolithography etching method to form a predetermined pattern that covers the sealing member 12 and a region excluding a portion of the front surface 11a of the semiconductor element 11 that forms the first and second electrodes 13, 14 (electrode pads). After patterning of the first layer 1511, a seed layer 16 covering the first layer 1511 and the exposed portion of the semiconductor element 11 is formed, for example, by a vacuum film formation method such as sputtering. The seed layer 16 is formed, for example, of Cu or other conductive material.

Figure 3E:
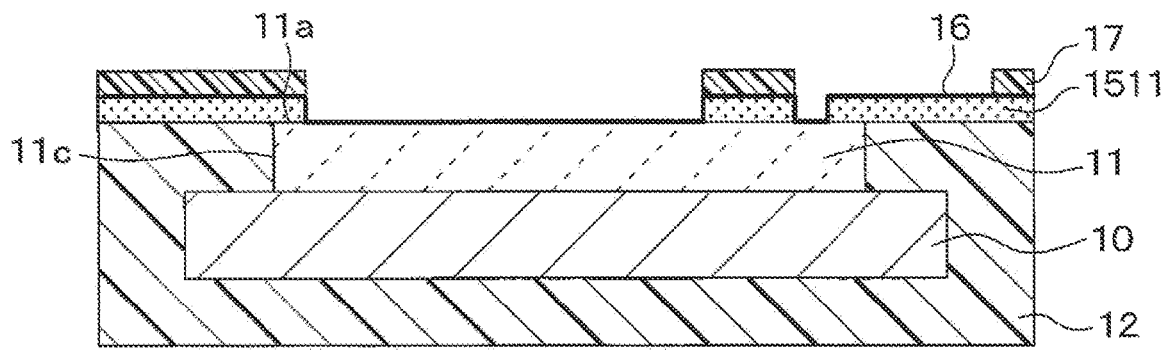
FIG. 3E is a cross-sectional view illustrating another part of the manufacturing process that is performed subsequently to the part illustrated in FIG. 3D.

Next, a resist layer 17 is formed so as to cover the first layer 1511 and the seed layer 16. The resist layer 17 is formed by the spin coating method or other film formation method, as is the case with the first layer 1511, by using a photosensitive and insulating resin material, and a predetermined pattern is formed by a photolithography etching method. This ensures that electrode pads for forming the first and second electrodes 13, 14 of the semiconductor element 11 and a part of the first layer 1511 are exposed from the resist layer 17 as shown in FIG. 3E.

Figure 3F:
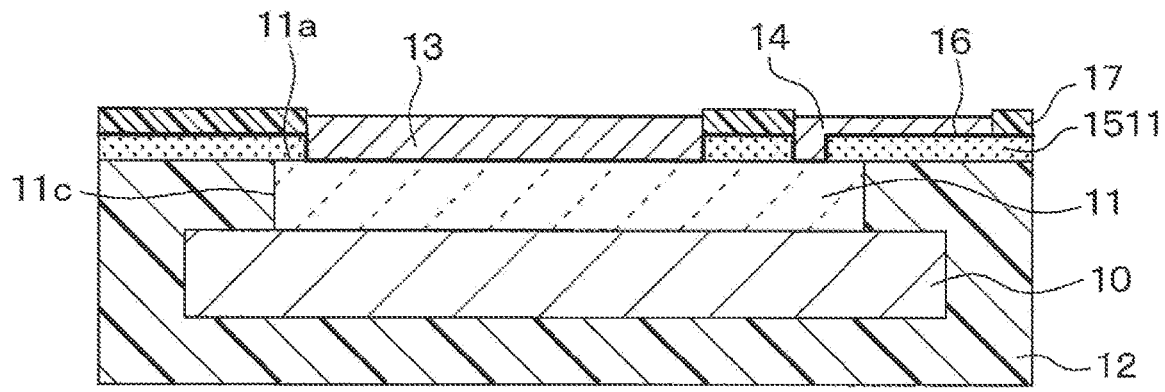
FIG. 3F is a cross-sectional view illustrating another part of the manufacturing process that is performed subsequently to the part illustrated in FIG. 3E.

Next, as shown in FIG. 3F, for example, an electroplating method is used to form the first and second electrodes 13, 14, which are made, for example, of Cu.

Figure 3G:
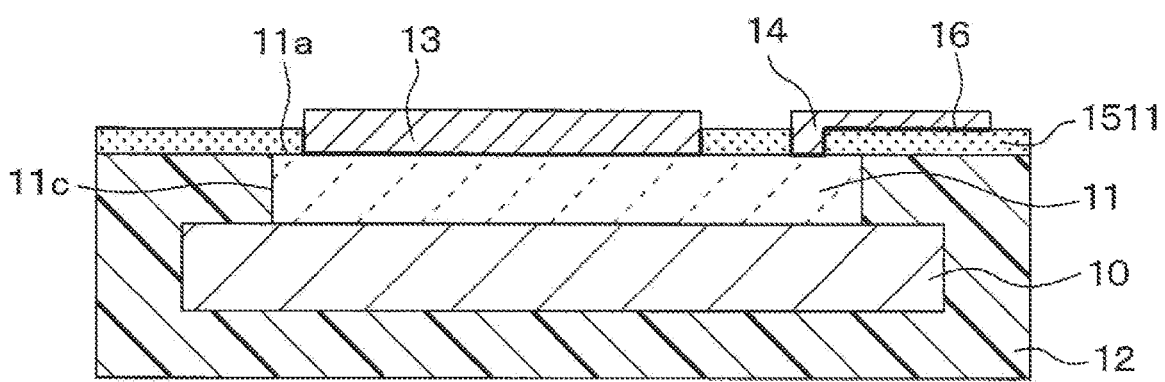
FIG. 3G is a cross-sectional view illustrating another part of the manufacturing process that is performed subsequently to the part illustrated in FIG. 3F.

Next, as shown in FIG. 3G, the resist layer 17 is removed by using, for example, a peeling solution, and then an etching solution is used to remove a portion of the seed layer 16 that is exposed upon removal of the resist layer 17.

Figure 3H:
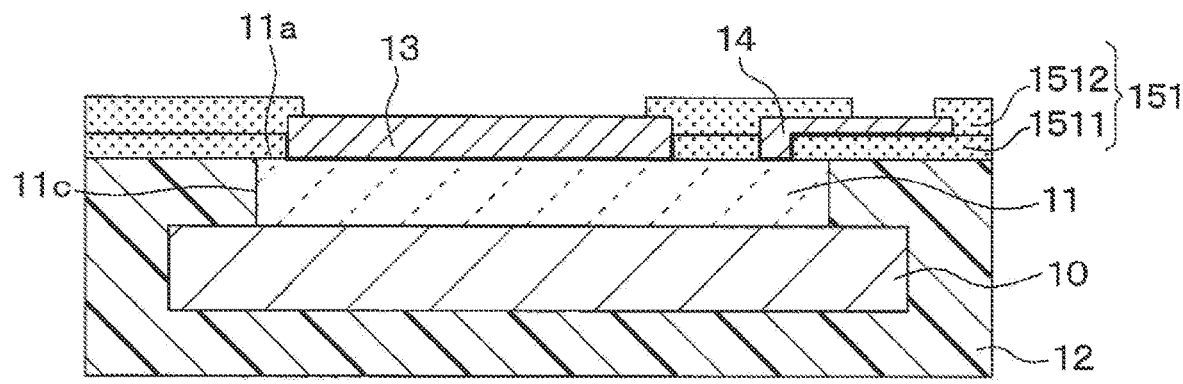
FIG. 3H is a cross-sectional view illustrating another part of the manufacturing process that is performed subsequently to the part illustrated in FIG. 3G.

Subsequently, a second layer 1512 to be included in the insulating layer 151 is formed by the spin coating method through the use, for example, of a photosensitive and insulating resin material, as is the case with the first layer 1511, and then patterning is performed by a photolithography etching method. This results in forming the insulating layer 151 to be included in the rewiring layer 15, as shown in FIG. 3H. In the resulting state, the first and second electrodes 13, 14 are partly exposed outward from the insulating layer 151.

Figure 3I:
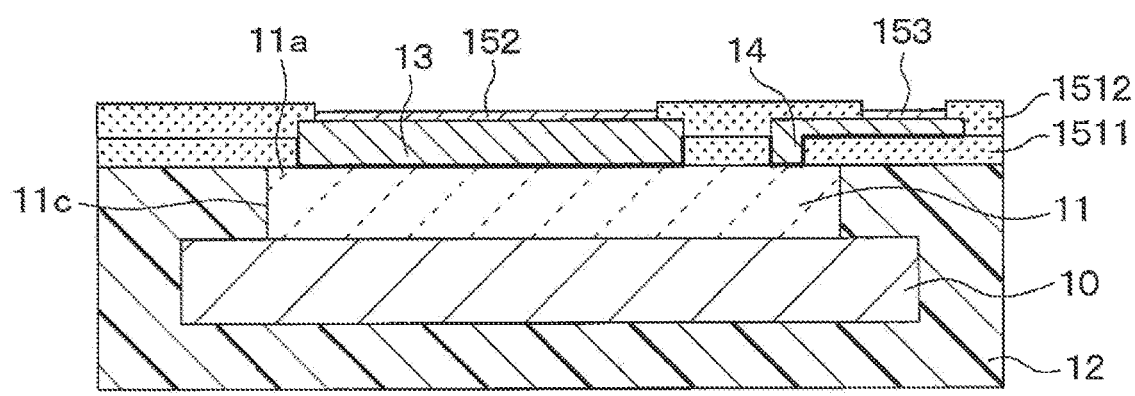
FIG. 3I is a cross-sectional view illustrating another part of the manufacturing process that is performed subsequently to the part illustrated in FIG. 3H.

Next, as shown in FIG. 3I, the first externally-exposed layer 152, which covers the first electrode 13, and the second externally-exposed layers 153, which cover a part of the plurality of second electrodes 14, are formed, for example, of Ni through the use of an electroless plating method. As a result, the rewiring layer 15 including the first electrode 13, the second electrodes 14, the insulating layer 151, and the first and second externally-exposed layers 152, 153 is formed on the semiconductor element 11 and the sealing member 12.

Figure 3J:
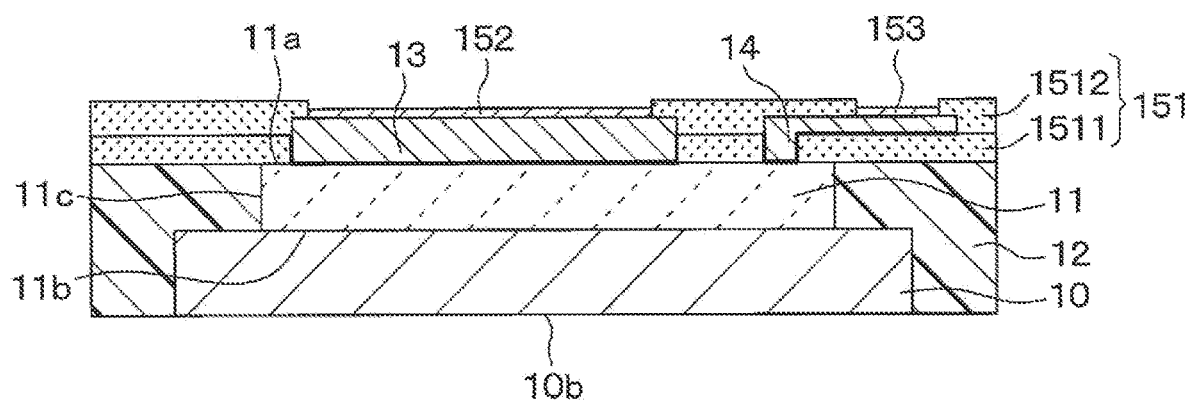
FIG. 3J is a cross-sectional view illustrating another part of the manufacturing process that is performed subsequently to the part illustrated in FIG. 3I.

Finally, as shown in FIG. 3J, the conductive member 10 is exposed, for example, by grinding or otherwise thinning the sealing member 12 from a surface positioned toward the rear surface 11b of the semiconductor element 11. When the conductive member 10 is joined to the rear surface 11b of the semiconductor element 11 and exposed, for example, by grinding or otherwise thinning the sealing member 12, no electrode needs to be newly formed on the rear surface 11b of the semiconductor element 11 after thinning. This reduces the cost of manufacturing.

The semiconductor device 1 according to the present embodiment can be manufactured, for example, by performing the above-described process.

The above-described manufacturing method is merely an example. The applicable manufacturing method is not limited to the above-described one. For example, the first electrode 13, the second electrodes 14, and the other wirings may be formed by repeatedly performing the above-described rewiring formation process in order to form a more multilayered rewiring layer 15. Further, the first electrode 13 and the second electrodes 14 may be formed by a screen printing method instead of the electroplating method.

Figure 4A:
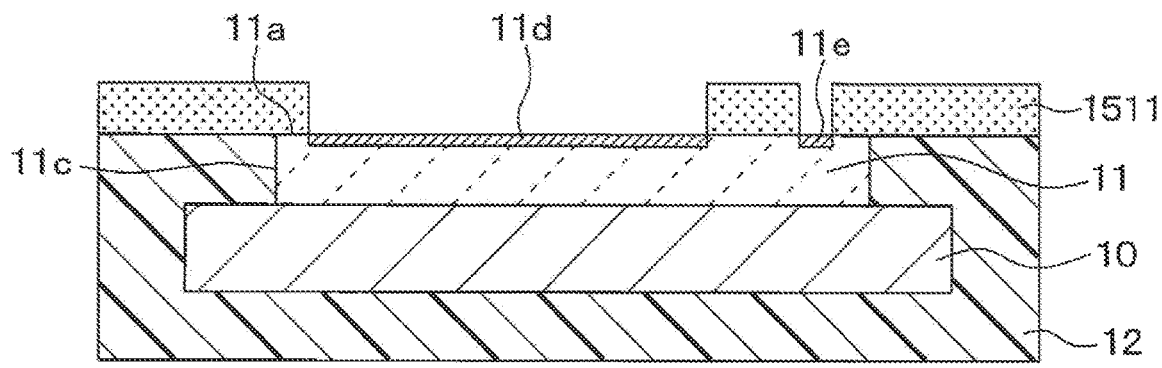
FIG. 4A is a cross-sectional view illustrating a part of another manufacturing process of the semiconductor device according to the first embodiment that is performed to form an insulating layer.
Figure 4B:
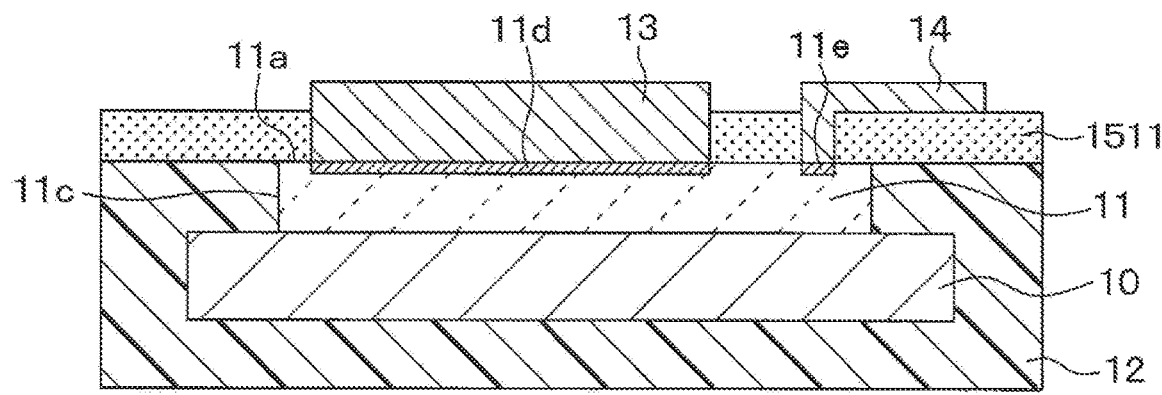
FIG. 4B is a cross-sectional view illustrating a part of the manufacturing process that is performed subsequently to the part illustrated in FIG. 4A.

More specifically, the semiconductor element 11 on which electrode pads 11d, 11e are formed is prepared, and the same steps described with reference to FIGS. 3A to 3C are performed to join the semiconductor element 11 to the conductive member 10. Subsequently, as shown in FIG. 4A, the first layer 1511, which is a part of the insulating layer 151, is formed and patterned to expose the electrode pads 11d, 11e from the insulating layer 151. Next, as shown in FIG. 4B, for example, a film of a sintered Cu paste material may be formed by screen printing through the use of a screen mask (not shown), and then sintered in order to form the first electrode 13 connected to the electrode pad 11d and form the second electrodes 14 connected to the electrode pad 11e.

Performing the above-described process simplifies the process of forming the first and second electrodes 13, 14 and makes the thickness of the first and second electrodes 13, 14 greater than the electroplating method. When the first and second electrodes 13, 14 are formed by the screen printing method, the thickness of the first and second electrodes 13, 14 can easily be increased to 20 μm or more. This makes it possible to provide low inductance by resistance reduction and reduce the thermal resistance of wiring by film thickening.

Figure 4C:
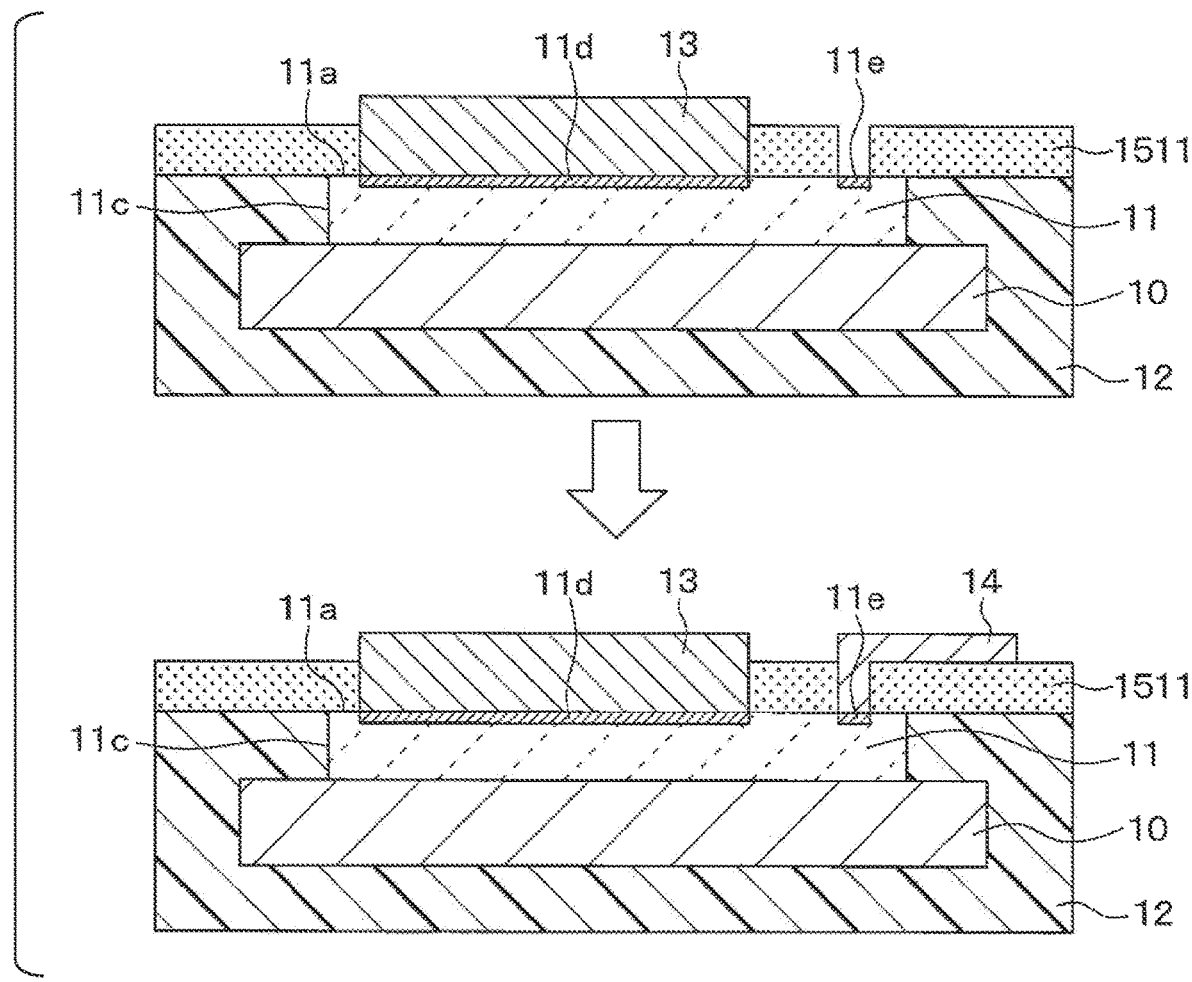
FIG. 4C is a cross-sectional view illustrating an example in which a first electrode and second electrodes are separately formed in the rewiring layer.

Further, as shown in FIG. 4C, the first electrode 13 and the second electrodes 14 may be formed of different paste materials. For example, in a case where the first electrode 13 is connected to an emitter with the second electrodes 14 connected to a gate for signal transmission purposes, the second electrodes 14 may be formed of a low-stress paste material after the first electrode 13 is formed of a sintered Cu paste material. For example, a conductive paste material formed of a resin material including a silver filler may be used as the low-stress paste material. This makes it easier to form the first and second electrodes 13, 14 with materials suitable for required characteristics than when the electroplating method is used for formation.

[Advantageous Effect of Conductive Member]

The conductive member 10 prevents the interface between the side surface 11c of the semiconductor element 11 and the sealing member 12 from being exposed by grinding in a thinning process, and plays a role of suppressing the peeling of the side surface 11c of the semiconductor element 11 and the sealing member 12 at their interface and the entry of moisture into the peeling interface.

A semiconductor device 300 according to a comparative example without the conductive member 10 will now be described. As shown, for example, in FIG. 5, the semiconductor device 300 having a FOP structure is configured so that a rear surface 301b of a semiconductor element 301 is exposed from a sealing member 302. The rear surface 301b is opposite a front surface 301a of the semiconductor element 301 that is covered with a rewiring layer 303.

Figure 6:
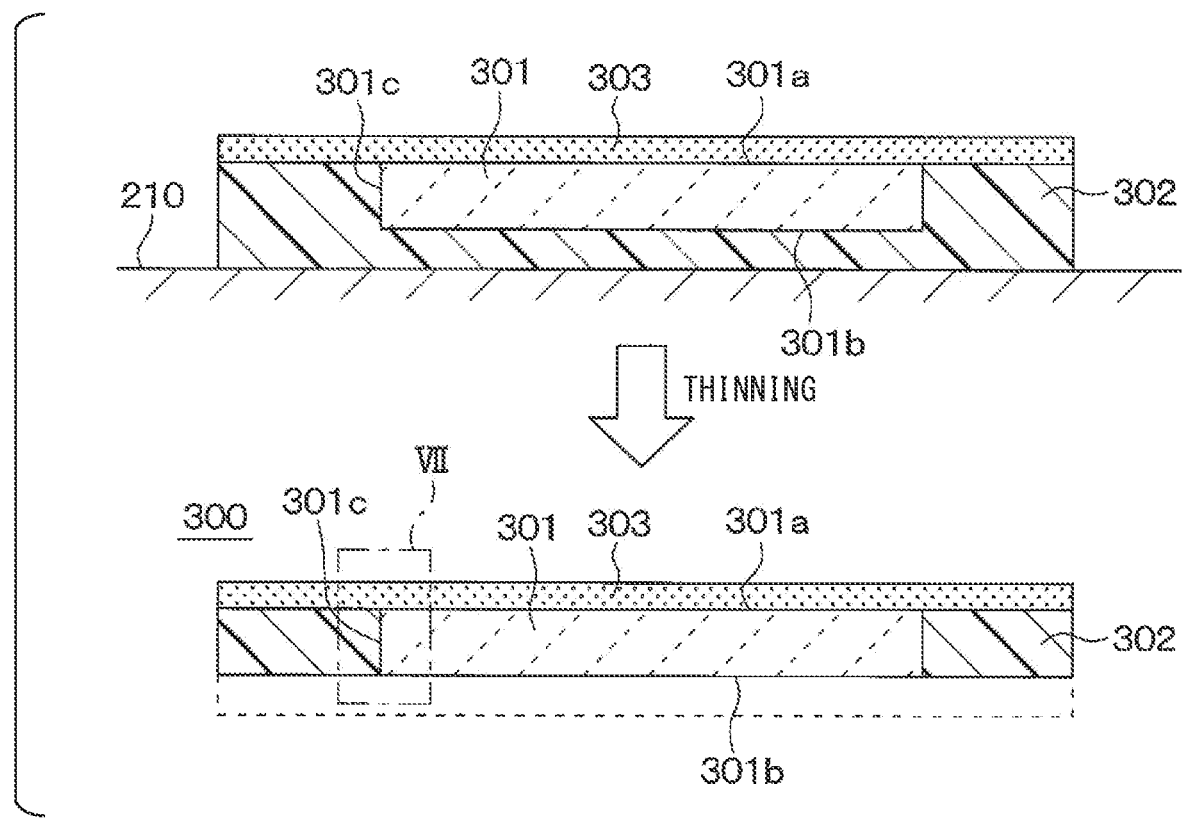
FIG. 6 is a cross-sectional view illustrating a part of a manufacturing process of the semiconductor device illustrated in FIG. 5 that is performed to grind a sealing member.

As shown, for example, in FIG. 6, the semiconductor device 300 is manufactured by covering the semiconductor element 301 with the sealing member 302 and grinding the sealing member 302 with a grinder 210 to remove the sealing member 302 from a surface positioned toward the rear surface 301b of the semiconductor element 301 regarding a workpiece on which the rewiring layer 303 is formed. When the sealing member 302 is to be ground and removed, the boundary between a side surface 301c of the semiconductor element 301 and the sealing member 302 is exposed to the surface of the grinder 210.

In the above instance, a grinding force is applied to the interface between the side surface 301c of the semiconductor element 301 and the sealing member 302. Therefore, peeling may occur at the interface as shown, for example, in FIG. 7. When such peeling occurs, the peeling of the interface may reach the rewiring layer 303 and cause wiring breakage in the rewiring layer 303.

Further, the entry of moisture into the peeling interface may cause corrosion of a metal material in the rewiring layer 303, and cause evaporation of moisture entered at the time of reflow-induced joining of the semiconductor device 300 to another member, thereby peeling the rewiring layer 303 and breaking the wiring. Furthermore, when the moisture entered into the peeling interface reaches the interface between the surface of the semiconductor element 301 and the rewiring layer 303 and stays at the interface, the adhesion between the semiconductor element 301 and the rewiring layer 303 decreases. When the adhesion between the semiconductor element 301 and the rewiring layer 303 decreases in a case where a plurality of the semiconductor devices 300 are manufactured at a time, chip skipping and wafer breakage may occur to peel the semiconductor element 301 from the rewiring layer 303 at the time, for example, of heating or dicing.

Meanwhile, the semiconductor device 1 according to the present embodiment is configured such that the conductive member 10 having a larger plane size than the semiconductor element 11 is joined to the rear surface of the semiconductor element 11, and that the semiconductor element 11 is disposed inside the outline of the conductive member 10. Stated differently, the semiconductor device 1 is configured so that the boundary between the side surface 11c of the semiconductor element 11 and the sealing member 12 is covered up by the conductive member 10. Therefore, in the process of grinding the sealing member 12 to remove the sealing member 302 from a surface positioned toward the rear surface of the semiconductor element 11 (this process is hereinafter referred to as "rear surface grinding"), the boundary between the side surface 11c of the semiconductor element 11 and the sealing member 12 is not exposed to a grinder or other grinding tool. This reduces the stress applied to the interface between the side surface 11c of the semiconductor element 11 and the sealing member 12 during rear surface grinding, suppresses the occurrence of peeling at the interface, prevents the entry of moisture into the interface, and thus avoids the above-mentioned issues.

Figure 5:
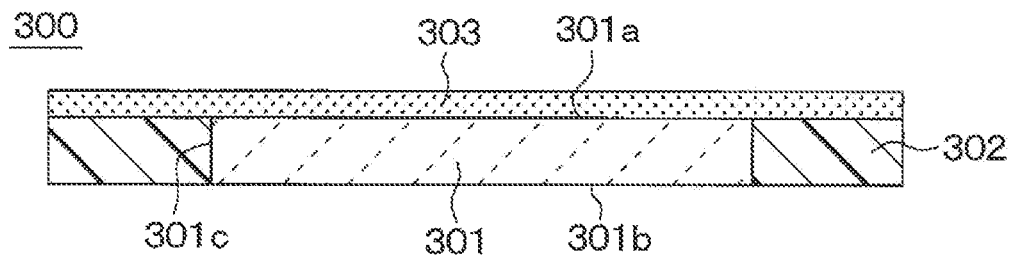
FIG. 5 is a cross-sectional view illustrating a semiconductor device having a fan-out package structure according to a comparative example.
Figure 7:
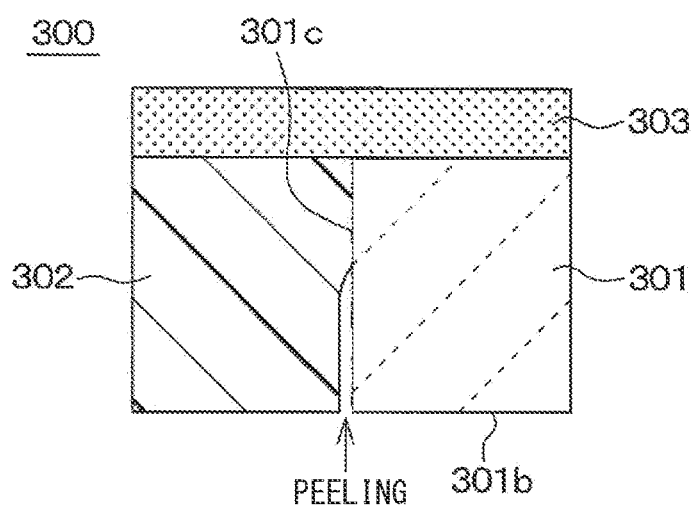
FIG. 7 is an enlarged cross-sectional view that is obtained by enlarging the VII region in FIG. 6 to illustrate the peeling of an interface between the sealing member and a side surface of a semiconductor element in the semiconductor device according to the comparative example.

FIGS. 5 to 7 do not depict electrodes positioned toward the front surface of the semiconductor element 301 and present simplified images of the rewiring layer 303 including the wiring connected to electrodes (not shown) on the semiconductor element 301.

Example Application to Semiconductor Module

Figure 8:
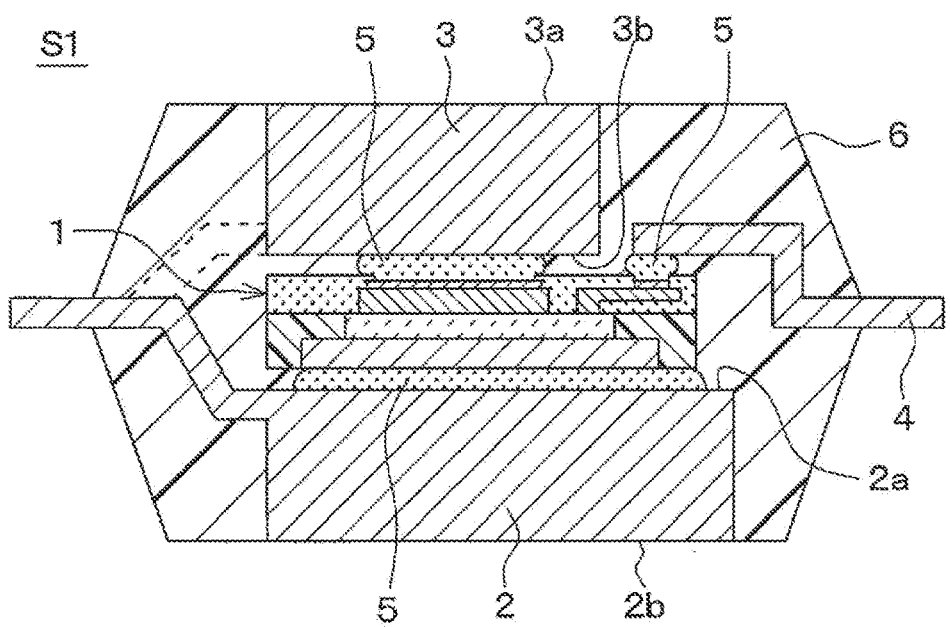
FIG. 8 is a cross-sectional view illustrating an example configuration of a semiconductor module that uses the semiconductor device according to the first embodiment.

An example of a semiconductor module that uses the semiconductor device 1 according to the present embodiment will now be described with reference to FIG. 8. In FIG. 8, broken lines are used to indicate a wiring of a later-described second heat sink 3 that is connected to the outside in another cross-section.

It is preferable that the semiconductor device 1 be applied to a semiconductor module S1 having a double-sided heat dissipation structure as shown, for example, in FIG. 8 because the semiconductor module can be thinned and provided with high heat dissipation. Although a case where the semiconductor device 1 is applied to a semiconductor module having a double-sided heat dissipation structure is described as a typical example in this document, the semiconductor device 1 is not limited to such an application example.

As shown in FIG. 8, the semiconductor module S1 includes a semiconductor device 1, a first heat sink 2, a second heat sink 3, a lead frame 4, a joining material 5, and a sealing member 6. The semiconductor module S1 has a double-sided heat dissipation structure in which the semiconductor device 1 is sandwiched between the two heat sinks 2, 3 disposed to face each other so that heat generated by the semiconductor device 1 dissipates to the outside from both surfaces of the semiconductor device 1 through the heat sinks 2, 3.

As shown in FIG. 8, the first heat sink 2 is shaped like a plate and has an upper surface 2a and a lower surface 2b. The upper surface 2a and the lower surface 2b are two sides of the same thing. The first heat sink 2 is formed, for example, of Cu, Fe (iron), or other metal material. The first heat sink 2 is configured such that the semiconductor device is mounted on the upper surface 2a through the joining material 5 formed of solder, and that the lower surface 2b is exposed from the sealing member 6. For example, the first heat sink 2 is regarded as a current path for energizing the semiconductor device 1, and a part positioned toward the upper surface 2a is extended to the outside of the sealing member 6. That is to say, the first heat sink 2 in the present embodiment plays two roles, namely, functions as a heat dissipation member and functions as a wiring. The first heat sink 2 may be referred to as the "first heat dissipation member."

The semiconductor device 1 is configured such that the side toward the rear surface 1b is connected to the first heat sink 2 through the joining material 5, and that the side toward the front surface 1a is connected to the second heat sink 3 through the joining material 5. The semiconductor device 1 is disposed so that the rear surface 1b is entirely positioned inside the outline of the upper surface 2a of the first heat sink 2. A surface of the second heat sink 3 that is exposed to the outside is referred to as one surface 3a, and a surface of the second heat sink 3 that faces the semiconductor device 1 is referred to as the other surface 3b. For example, a partial region of the semiconductor device 1 that includes the second externally-exposed layers 153 is positioned outside the outline of the other surface 3b of the second heat sink 3. The second externally-exposed layers 153 of the semiconductor device 1 are connected, for example, to the lead frame 4 through the joining material 5.

As shown in FIG. 8, the second heat sink 3 is shaped like a plate and has one surface 3a and the other surface 3b. The one surface 3a and the other surface 3b are two sides of the same thing. The second heat sink 3 is formed of a material similar to the one used for the first heat sink 2. The second heat sink 2 is configured such that the other surface 3b is disposed to face a part of the upper surface 2a of the semiconductor device 1, and that the one surface 3a is exposed from the sealing member 6. The second heat sink 3 is electrically connected to the first externally-exposed layer 152 and the first electrode 13 through the joining material 5, and regarded as a current path for the semiconductor element 11 as is the case with the first heat sink 2. Further, the second heat sink 3 is configured such that a part positioned toward the other surface 3b is extended to the outside of the sealing member 6 to play two roles, namely, functions as a heat dissipation member and as an electrical wiring. The second heat sink 3 may be referred to as the "second heat dissipation member."

The lead frame 4 is formed, for example, of Cu, Fe, or other metal material, and electrically connected to the second externally-exposed layers 153 of the semiconductor device 1 through the joining material 5. The lead frame 4 includes, for example, the same number of leads as the second electrodes 14.

The leads are configured such that the adjacent leads are coupled to each other by a tie bar (not shown). However, the adjacent leads are separated from each other when the tie bar is removed, for example, by press cutting after the formation of the sealing member 6. Further, the lead frame 4 may be formed as the same member as the second heat sink 3 and allowed to remain coupled by the tie bar until the formation of the sealing member 6. Even in such a case, the lead frame 4 is separated from the second heat sink 3 when the tie bar is removed, for example, by press cutting after the formation of the sealing member 6.

The joining material 5 joins the components of the semiconductor module S1, and is formed of a conductive material for electrical connection, such as solder. The joining material 5 is not limited to solder.

The sealing member 6 is formed, for example, of epoxy resin or other thermosetting resin. As shown in FIG. 8, the sealing member 6 covers the semiconductor device 1, some parts of the heat sink 2, 3, a part of the lead frame 4, and the joining material 5. In a case where the sealing member 12 included in the semiconductor device 1 is referred to as the "first sealing member," the sealing member 6 may be referred to as the "second sealing member," which covers the semiconductor device 1.

The semiconductor module S1 is configured so that the joining material 5 is used to join the second externally-exposed layers 153 of the semiconductor device 1 to the lead frame 4. Therefore, the semiconductor device 1 need not be wire-connected to the lead frame 4 unlike the semiconductor module according to the related art. Further, since no wiring is used, the heat dissipation block for avoiding contact between the wiring and the second heat sink 3 need not be disposed between the semiconductor device 1 and the second heat sink 3. This decreases the thickness of the semiconductor module by the thickness of the heat dissipation block and eliminates the thermal resistance of the heat dissipation block. Therefore, the thermal resistance between the semiconductor device 1 and the second heat sink 3 is reduced.

Consequently, the use of the semiconductor device 1 causes the semiconductor module S1 to be configured so as to provide less thickness and lower thermal resistance than before.

According to the present embodiment, the boundary between the side surface 11c of the semiconductor element 11 and the sealing member 12 is covered with the conductive member 10. This reduces the force that is applied to the boundary during the process of grinding the sealing member 12. Therefore, the semiconductor device 1 has the FOP structure in which the occurrence of peeling at the boundary is suppressed. Further, the semiconductor device 1 is configured such that the conductive member 10 is joined to the rear surface 11b of the semiconductor element 11 and is exposed from the sealing member 12 earlier than the semiconductor element 11 during the process of grinding the sealing member 12. Therefore, the rear surface electrode of the semiconductor element 11 remains ungrounded at the time of grinding. This is to say, the semiconductor device 1 requires a simpler manufacturing process than before, and does not require an electrode formation process to be performed on the rear surface 11b after thinning. Accordingly, the semiconductor device 1 is configured to reduce its manufacturing cost. Moreover, the semiconductor device 1 can be joined to the second externally-exposed layers 153 through the joining material 5 so as to permit the lead frame 4 to be electrically connected to the second electrodes 14, which act as a fan-out wiring. Therefore, the semiconductor device 1 is particularly suitable for thinning and reducing the thermal resistance of a semiconductor module having a double-sided heat dissipation structure.

First Modification of First Embodiment

Figure 9:
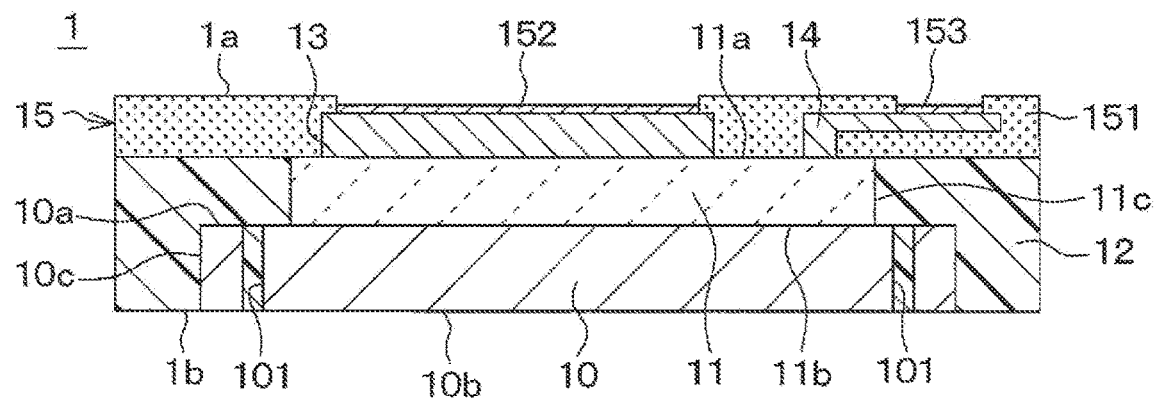
FIG. 9 is a cross-sectional view illustrating a semiconductor device according to a first modification of the first embodiment.

As shown, for example, in FIG. 9, the semiconductor device 1 may have a through-hole 101 that is formed in the conductive member 10 outside the outline of the semiconductor element 11 and extended in the direction of thickness. The through-hole 101 is formed in order to suppress the occurrence of peeling at the interface between the side surface 10c of the conductive member 10 and the sealing member 12.

More specifically, the through-hole 101 disperses the force that is applied to the boundary between the side surface 10c of the conductive member 10 and the sealing member 12 when the sealing member 12 is ground from the side toward the rear surface 11b of the semiconductor element 11 in a state illustrated in FIG. 3I during a manufacturing process for the semiconductor device 1 according to the first embodiment, which is described above. In a case where the through-hole 101 is not formed in the conductive member 10, the force applied for grinding during the above-mentioned grinding process may act on and peel the boundary between the side surface 10c of the conductive member 10 and the sealing member 12.

Meanwhile, in a case where the through-hole 101 is formed in the conductive member 10, the force applied for grinding acts on the boundary between the side surface 10c of the conductive member 10 and the sealing member 12 and on the boundary between the through-hole 101 and the sealing member 12. That is to say, forming the through-hole 101 in the conductive member 10 reduces the force applied to the boundary between the side surface 10c of the conductive member 10 and the sealing member 12 and thus suppresses the occurrence of peeling at the interface between the side surface 10c of the conductive member 10 and the sealing member 12 during the grinding process for the sealing member 12. The number, size, and arrangement of through-holes 101 may be determined as appropriate and changed as needed.

Figure 10:
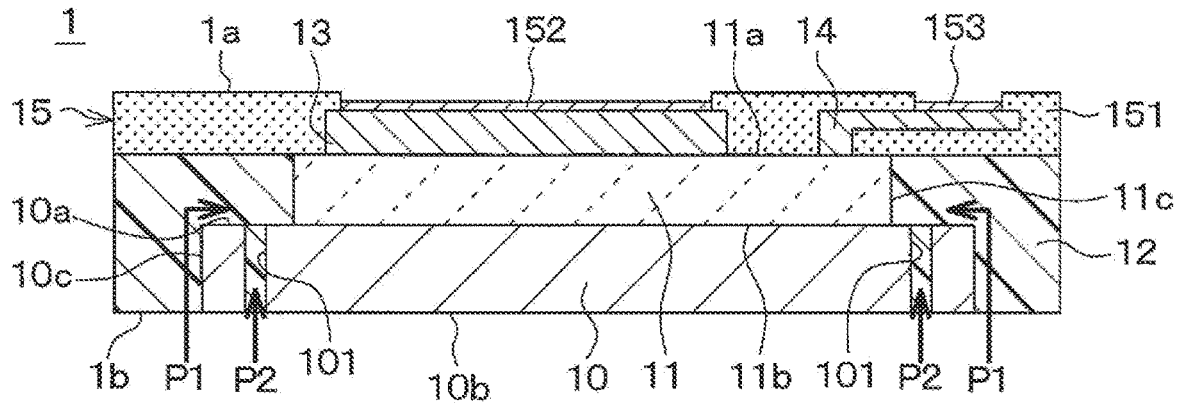
FIG. 10 is a diagram illustrating how a through-hole in the conductive member suppresses the peeling of an interface between the conductive member and the sealing member.

Even if interface peeling P1 occurs between the side surface 10c of the conductive member 10 and the sealing member 12 as indicated by arrows in FIG. 10 and is about to progress inward, the interface peeling P1 is stopped by the through-hole 101 in the upper surface 10a because the through-hole 101 is formed inside the side surface 10c. Further, the motion of the sealing member 12 filled into the through-hole 101 is limited by the inner wall of the through-hole 101 during a thermal cycle. Therefore, even if interface peeling P2 occurs between the through-hole 101 and the sealing member 12, the interface peeling P2 is not likely to progress inward. As a result, even when either interface peeling P1 or interface peeling P2 occurs, peeling is suppressed from reaching the interface between the side surface 11c of the semiconductor element 11 and the sealing member 12.

The present modification provides the same advantageous effect as the first embodiment, which is described above. Additionally, the present modification suppresses the occurrence of interface peeling at the boundary between the side surface 10c of the conductive member 10 and the sealing member 12. Therefore, even if interface peeling occurs at the boundary between the side surface 10c of the conductive member 10 and the sealing member 12, the interface peeling is not likely to reach the interface between the side surface 11c of the semiconductor element 11 and the sealing member 12. Consequently, the semiconductor device 1 provides an advantageous effect of increasing the reliability.

Second Modification of First Embodiment

Figure 11:
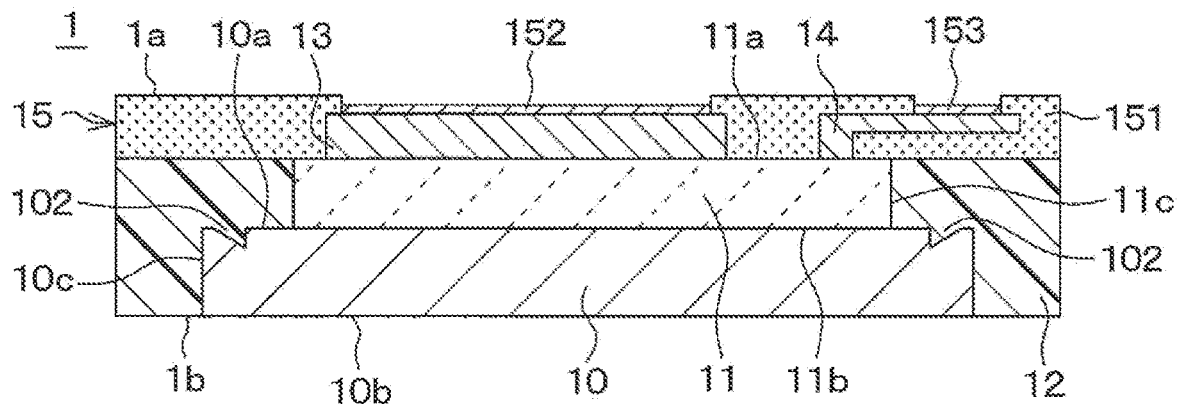
FIG. 11 is a cross-sectional view illustrating a semiconductor device according to a second modification of the first embodiment.

As shown, for example, in FIG. 11, the semiconductor device 1 may have a groove 102 in a portion of the conductive member 10 that is positioned outside the outline of the semiconductor element 11. The groove 102 is provided in order to hold back interface peeling when peeling occurs at the interface between the side surface 10c of the conductive member 10 and the sealing member 12 and thus prevent the interface peeling from progressing toward the interface between the side surface 11c of the semiconductor element 11 and the sealing member 12.

It is assumed, for example, that the groove 102 is annularly shaped to surround the semiconductor element 11. However, the groove 102 may have any shape as long as it is able to suppress the interface peeling at the boundary between the conductive member 10 and the sealing member 12 from progressing toward the semiconductor element 11. The groove 102 is formed, for example, by an appropriate machining method such as press machining or laser machining.

The present modification provides the same advantageous effect as the first embodiment, which is described above. Additionally, even if interface peeling occurs at the boundary between the conductive member 10 and the sealing member 12, the groove 102 according to the present modification holds back the interface peeling. Consequently, the semiconductor device 1 provides an advantageous effect of increasing the reliability of interfacial adhesion between the side surface 11c of the semiconductor element 11 and the sealing member 12.

Third Modification of First Embodiment

Figure 12:
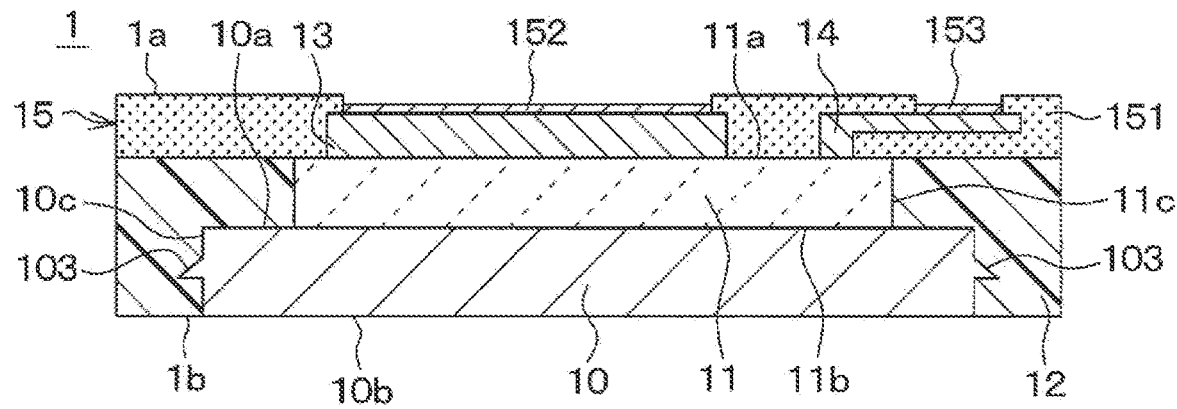
FIG. 12 is a cross-sectional view illustrating a semiconductor device according to a third modification of the first embodiment.

As shown, for example, in FIG. 12, the semiconductor device 1 may have a protrusion 103 on the side surface 10c of the conductive member 10. The protrusion 103 is provided in order to suppress a progress of an interface peeling when the interface peeling occurs at the boundary between the side surface 10c of the conductive member 10 and the sealing member 12.

The protrusion 103 is, for example, annularly formed on the whole region of the side surface 10c of the conductive member 10. However, the protrusion 103 may have any shape as long as it is able to suppress the interface peeling at the boundary between the side surface 10c of the conductive member 10 and the sealing member 12. The protrusion 103 is formed, for example, by an appropriate machining method such as cutting machining.

The semiconductor device 1 according to the present modification provides the same advantageous effect as the second modification, which is described above.

Fourth Modification of First Embodiment

Figure 13:
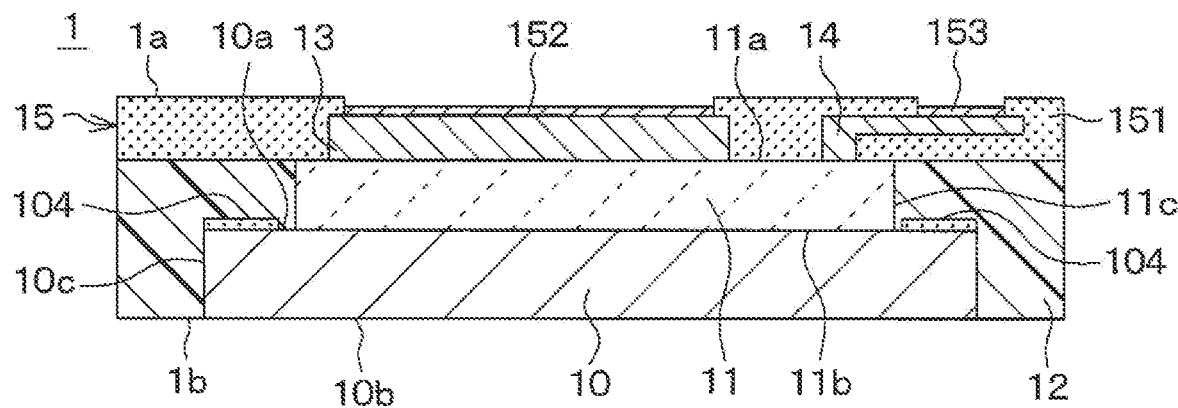
FIG. 13 is a cross-sectional view illustrating a semiconductor device according to a fourth modification of the first embodiment.

As shown, for example, in FIG. 13, the semiconductor device 1 may have a high adhesion section 104 on a portion of the upper surface 10a of the conductive member 10 that is positioned outside the outline of the semiconductor element 11. The high adhesion section 104 is provided in order to improve adhesion to the sealing member 12 and, in the event of interface peeling at the boundary between the side surface 10c of the conductive member 10 and the sealing member 12, suppress the interface peeling from progressing toward the semiconductor element 11.

It is assumed, for example, that the high adhesion section 104 is made of a resin material such as polyimide and formed by an appropriate wet film formation method such as dispenser coating. For example, the high adhesion section 104 is assumed to be annularly shaped to surround the semiconductor element 11 on the upper surface 10a in a frame-like manner. However, the shape of the high adhesion section 104 is not limited to such an annular shape. For example, the arrangement and shape of the high adhesion section 104 may be changed as appropriate.

The semiconductor device 1 according to the present modification provides the same advantageous effect as the second modification, which is described above.

Fifth Modification of First Embodiment

Figure 14:
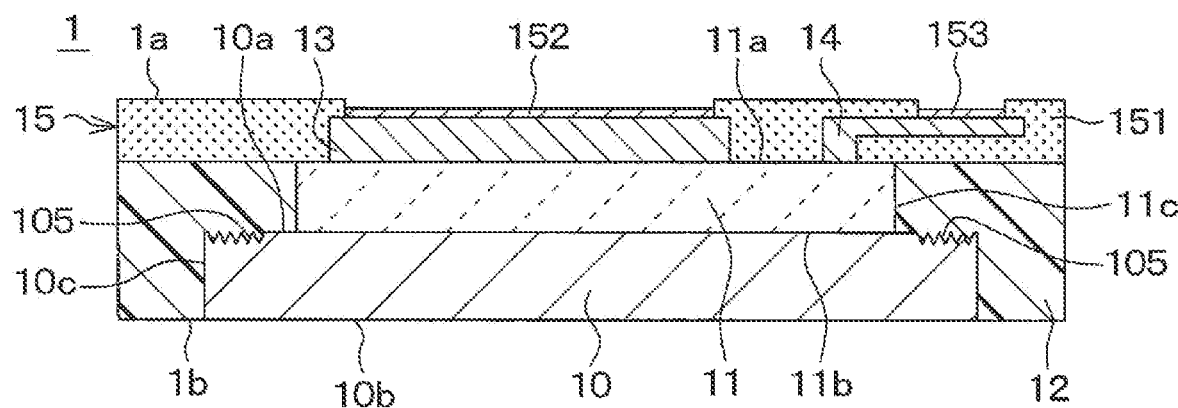
FIG. 14 is a cross-sectional view illustrating a semiconductor device according to a fifth modification of the first embodiment.

As shown, for example, in FIG. 14, the semiconductor device 1 may have a roughened section 105. The roughened section 105 has surface irregularities of micrometer order or less and is formed on a portion of the upper surface 10a of the conductive member 10 that is positioned outside the outline of the semiconductor element 11. The roughened section 105 is provided in order to improve adhesion to the sealing member 12 by an anchor effect and suppress a progress of an interface peeling toward the semiconductor element 11 even when the interface peeling occurs at the boundary between the side surface 10c of the conductive member 10 and the sealing member 12. It is assumed, for example, that the roughened section 105 is annularly shaped to surround the semiconductor element 11 on the upper surface 10a in a frame-like manner. However, the shape of the roughened section 105 is not limited to such an annular shape. For example, the arrangement and shape of the roughened section 105 may be changed as appropriate. The roughened section 105 is formed, for example, by an appropriate machining method such as laser machining. The semiconductor device 1 according to the present modification provides the same advantageous effect as the second modification, which is described above.

Sixth Modification of First Embodiment

Figure 15:
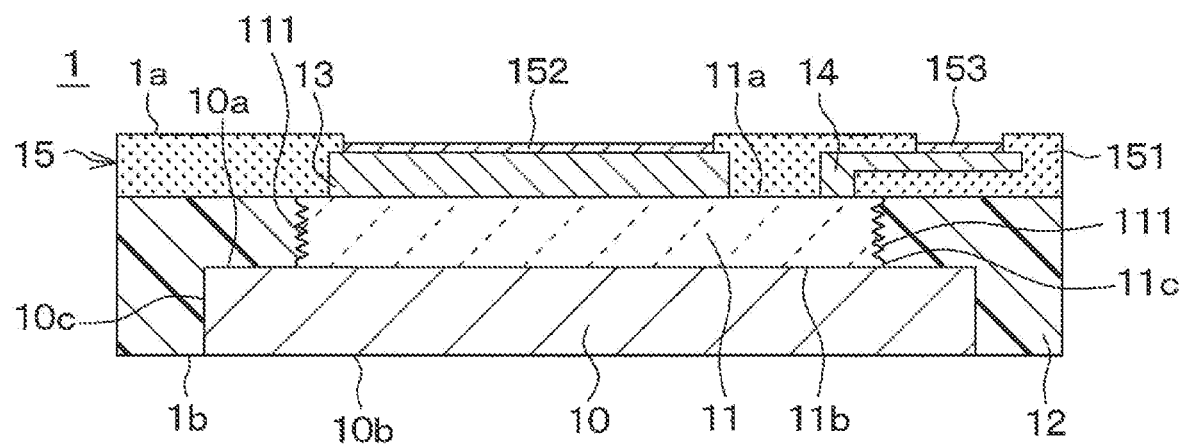
FIG. 15 is a cross-sectional view illustrating a semiconductor device according to a sixth modification of the first embodiment.

As shown, for example, in FIG. 15, the semiconductor device 1 may be configured such that a roughened section 111 having surface irregularities of micrometer order or less is formed on the side surface 11c of the semiconductor element 11. The roughened section 111 is provided in order to improve adhesion to the sealing member 12 by the anchor effect and suppress a progress of an interface peeling even when the interface peeling occurs at the boundary between the conductive member 10 and the sealing member 12, The roughened section 111 may be formed, for example, by performing a roughening process through the use of a laser machining technique when dicing the semiconductor element 11 from a silicon wafer. For simplified explanation, the roughening process performed by laser-machining the side surface 11c of the semiconductor element 11 as mentioned earlier may be hereinafter referred to as the "laser dicing."

The present modification provides the same advantageous effect as the first embodiment, which is described above. Additionally, even if interface peeling occurs at the boundary between the conductive member 10 and the sealing member 12, the present modification suppresses the interface peeling from progressing toward the rewiring layer 15 by providing improved interfacial adhesion between the side surface 11c of the semiconductor element 11 and the sealing member 12, and thus enhances the reliability of the semiconductor device 1.

Seventh Modification of First Embodiment

Figure 16:
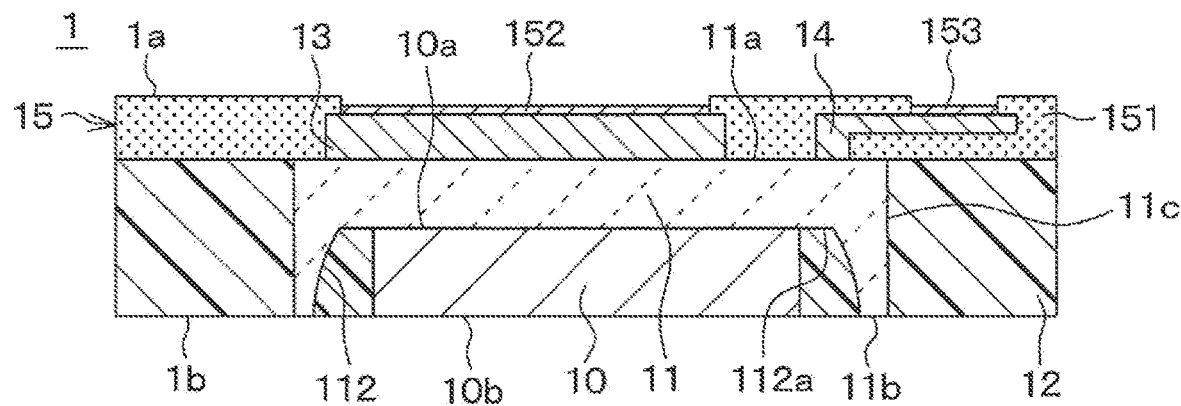
FIG. 16 is a cross-sectional view illustrating a semiconductor device according to a seventh modification of the first embodiment.

As shown, for example, in FIG. 16, the semiconductor device 1 may be configured such that a recessed section 112 is formed on the rear surface 11b of the semiconductor element 11, and that the conductive member 10 is accommodated in the recessed section 112 and joined to the bottom 112a of the recessed section 112. The "bottom 112a of the recessed section 112" is a portion of the recessed section 112 that is positioned at the bottom when viewed from the normal direction with respect to the side toward the rear surface 11b.

In the above configuration, the thickness of the semiconductor element 11 is greater than in the first embodiment, which is described above. This increases the contact area between the side surface 11c of the semiconductor element 11 and the sealing member 12, and thus suppresses the occurrence of interface peeling at the boundary between the side surface 11c of the conductive member 10 and the sealing member 12 during rear surface grinding of the sealing member 12. Further, in the present modification, the conductive member 10 has a smaller plane size than the semiconductor element 11 and has a thickness equivalent to the depth of the recessed section 112.

The recessed section 112 is formed, for example, by forming a protective film shaped in a predetermined pattern on the rear surface 11b of the semiconductor element 11 and then performing a silicon anisotropic etching process on a portion exposed from the protective film through the use of an appropriate alkaline solution suitable for silicon etching. Alternatively, the recessed section 112 may be formed by preparing an annular silicon substrate having a larger inside diameter than the outer size of the conductive member 10 and then bonding the prepared silicon substrate to the rear surface 11b of the semiconductor element 11 by anodic bonding. In the latter case, the rear surface 11b of the semiconductor element 11 is the bottom 112a of the recessed section 112.

In the present modification, the boundary between the side surface 11c of the semiconductor element 11 and the sealing member 12 comes into contact with the surface of a grinder during the rear surface grinding of the sealing member 12. However, the contact area between the side surface 11c of the semiconductor element 11 and the sealing member 12 increases to suppress the occurrence of peeling at the boundary. Further, the boundary coming into contact with a grinder or other grinding tool during the rear surface grinding of the sealing member 12 includes the boundary between the conductive member 10 and the sealing member 12 and the boundary between the recessed section 112 and the sealing member 12 in addition to the boundary between the side surface 11c of the semiconductor element 11 and the sealing member 12. Therefore, the force applied during the rear surface grinding is dispersed to reduce the force applied to the boundary between the side surface 11c of the semiconductor element 11 and the sealing member 12 and thus suppress the occurrence of peeling at the boundary.

Consequently, as is the case with the first embodiment, which is described above, the present modification suppresses the occurrence of interface peeling at the boundary between the side surface 11c of the semiconductor element 11 and the sealing member 12, and thus enhances the reliability of the semiconductor device 1.

Second Embodiment

Figure 17:
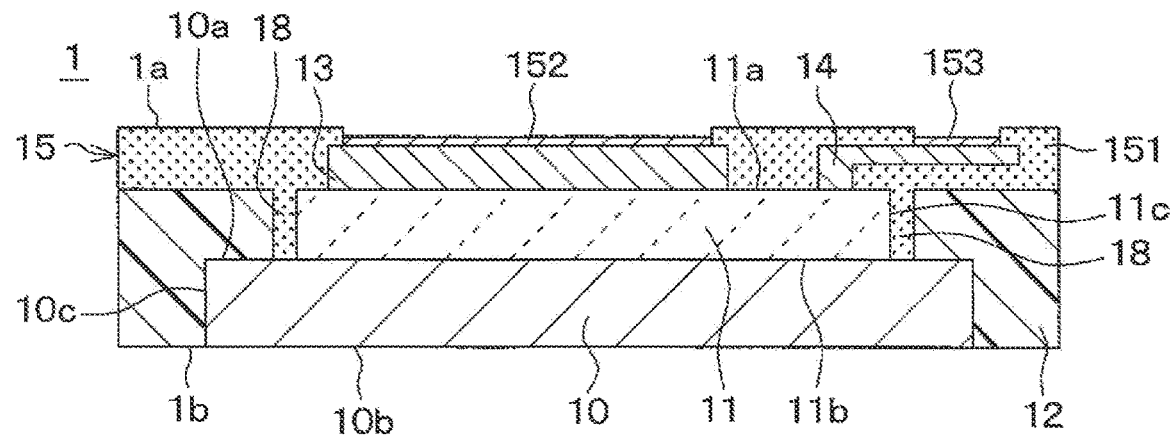
FIG. 17 is a cross-sectional view illustrating a configuration of a semiconductor device according to a second embodiment.

A semiconductor device 1 according to a second embodiment will now be described with reference to FIGS. 17 to 19. As shown, for example, in FIG. 17, the semiconductor device 1 according to the second embodiment differs from the semiconductor device 1 according to the first embodiment in that the side surface 11c of the semiconductor element 11 is covered with a side wall insulating section 18 formed of an insulating material. The second embodiment is described below by mainly explaining the difference from the first embodiment.

The semiconductor device 1 according to the second embodiment is manufactured by a manufacturing process illustrated, for example, in FIGS. 18A to 18D.

Figure 18A:
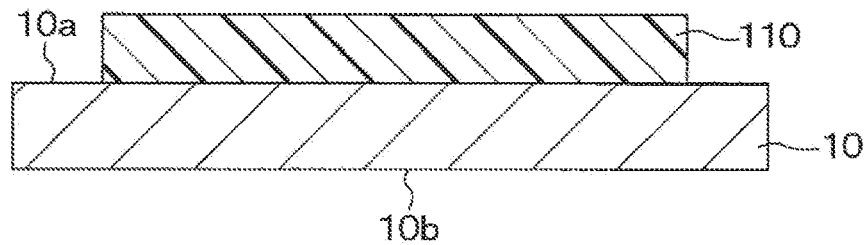
FIG. 18A is a cross-sectional view illustrating a part of a manufacturing process for the semiconductor device according to the second embodiment that is performed to form a temporary protective material on the conductive member.
Figure 19:
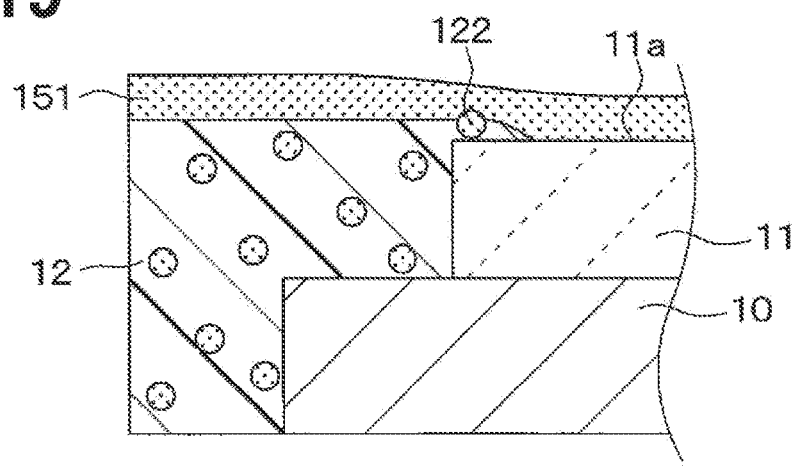
FIG. 19 is an enlarged cross-sectional view illustrating an example in which a filler enters between an insulating layer and a semiconductor element in a case where a sealing member including the filler is molded after a conductive member is joined to the semiconductor element.

More specifically, first of all, as shown in FIG. 18A, a film of a temporary protective member 110 is formed in a predetermined region of the upper surface 10a of the conductive member 10 that includes a region to which the semiconductor element 11 is to be joined later. The temporary protective member 110 is made, for example, of an adhesive material, a photosensitive resin material, or other appropriate material that can be peeled off after the formation of the sealing member 12. In a case where the temporary protective member 110 made, for example, of an adhesive material is to be used, an adhesive material decreasing its force of adhesion to the conductive member 10 when, for example, irradiated with ultraviolet rays or heated can be selected for use. Meanwhile, in a case where the temporary protective member 110 made of a photosensitive resin material is to be used, a positive resist material can be selected for use.

The temporary protective member 110 is used to form a recessed section 121 described later. However, in a case where the depth of the recessed section 121 is set to have a predetermined depth or greater (such as but not limited to a depth of 20 μm or greater), it is preferable that the temporary protective member 110 be made of an adhesive material and a temporary member. In this case, the temporary member may be made of any appropriate member as long as it is incompatible with constituent materials of the sealing member 12 and thermally resistant to heating during a molding process for the sealing member 12. The temporary protective member 110 is made larger in plane size than the semiconductor element 11 so that the semiconductor element 11 fits into the recessed section 121, which is to be formed later.

Figure 18B:
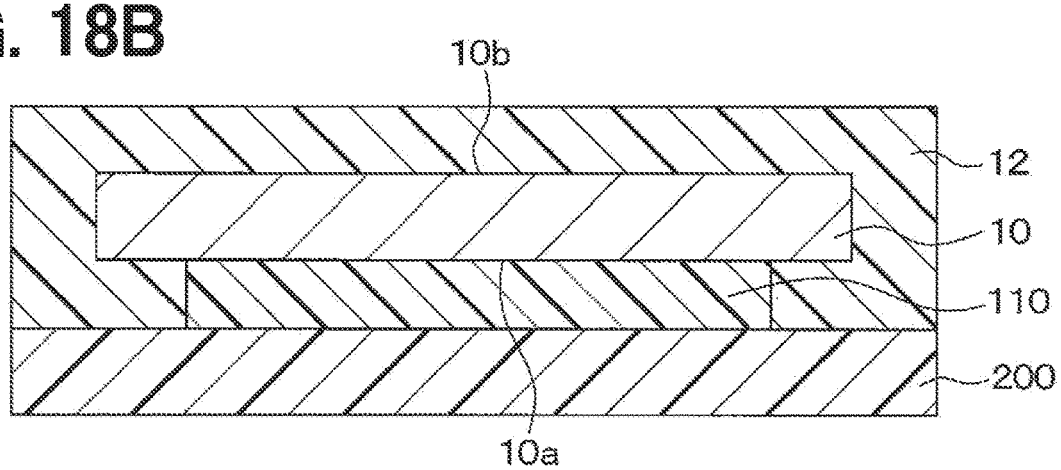
FIG. 18B is a cross-sectional view illustrating another part of the manufacturing process that is performed subsequently to the part illustrated in FIG. 18A.

Next, as shown in FIG. 18B, the temporary protective member 110 is pasted on the support substrate 200, and the sealing member 12 covering the conductive member 10 and the temporary protective member 110 is, for example, compression-molded or otherwise molded by using a mold (not shown).

Figure 18C:
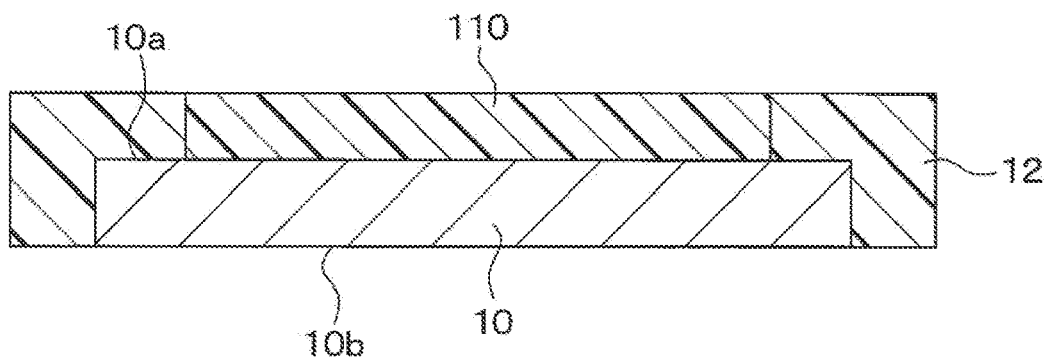
FIG. 18C is a cross-sectional view illustrating another part of the manufacturing process that is performed subsequently to the part illustrated in FIG. 18B.

Next, as shown in FIG. 18C, the workpiece having the temporary protective member 110 and the conductive member 10, which are covered with the sealing member 12, is peeled from the support substrate 200, and then the sealing member 12 is ground from the side toward the lower surface 10b of the conductive member 10 in order to expose the lower surface 10b of the conductive member 10. Next, the sealing member 12 having the recessed section 121 exposing the conductive member 10 is formed as shown, for example, in FIG. 18D, by peeling the temporary protective member 110 from the conductive member 10.

Figure 18D:
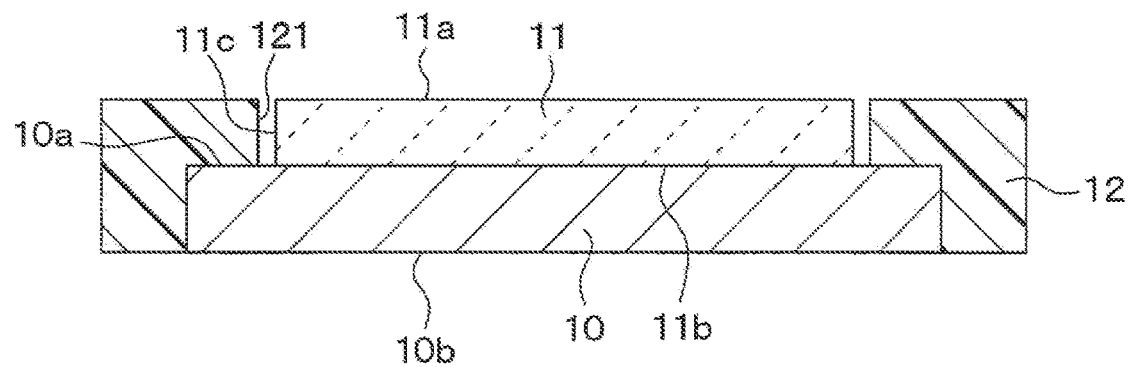
FIG. 18D is a cross-sectional view illustrating another part of the manufacturing process that is performed subsequently to the part illustrated in FIG. 18C.

Next, as shown in FIG. 18D, the semiconductor element 11 is accommodated in the recessed section 121, and then the rear surface 11b of the semiconductor element 11 is joined to the conductive member 10 by using a joining material (not shown). The semiconductor element 11 may alternatively be configured such that the roughened section 111 illustrated in FIG. 15 is formed on the side surface 11c, for example, by laser dicing in order to provide improved adhesion between the side surface 11c and the side wall insulating section 18, which is to be formed subsequently.

Figure 18E:
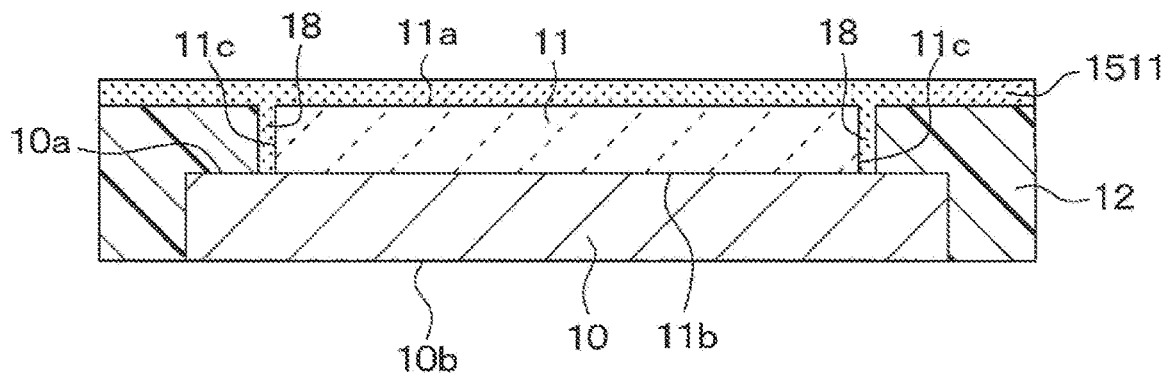
FIG. 18E is a cross-sectional view illustrating another part of the manufacturing process that is performed subsequently to the part illustrated in FIG. 18D.

Next, as shown in FIG. 18E, the first layer 1511 of the insulating layer 151 is formed, for example, by a wet film formation method such as a spin coating method. In this instance, an insulating layer material flows into the gap between the recessed section 121 and the side surface 11c of the semiconductor element 11, and hardens to form the first layer 1511 and the side wall insulating section 18. That is to say, the side wall insulating section 18 is formed of the same insulating material as the insulating layer 151, such as polyimide.

The semiconductor device 1 according to the second embodiment can be manufactured by forming the rewiring layer 15 through the use of the same process as that of the manufacturing method described in conjunction with the first embodiment, which is described above.

When the manufacturing method according to the first embodiment, which is described above, is used, the resin material included in the sealing member 12 may enter between the support substrate 200 and the front surface 11a of the semiconductor element 11 for some reason during the molding of the sealing member 12. If the sealing member 12 is formed of an insulating material including a filler 122 such as a heat dissipation filler, as shown in FIG. 19, the filler 122 may enter between the front surface 11a of the semiconductor element 11 and the insulating layer 151, which is a part of the rewiring layer 15. If the filler 122 exists between the insulating layer 151 and the semiconductor element 11, the thickness of the insulating layer 151 on the filler 122 decreases. This may cause insulation failure.

Meanwhile, the semiconductor device 1 according to the second embodiment is manufactured by molding the sealing member 12, joining the conductive member 10 to the semiconductor element 11, and forming a film of the insulating layer 151. Therefore, the constituent materials of the sealing member 12 do not exist on the front surface 11a of the semiconductor element 11. Consequently, the semiconductor device 1 is configured such that no insulation failure is caused by the filler 122 even in a case where the sealing member 12 is formed of an insulating material including the filler 122.

Further, since the conductive member 10 is joined to the semiconductor element 11 after the rear surface grinding of the sealing member 12, no stress is applied between the side surface 11c of the semiconductor element 11 and the side wall insulating section 18 during grinding, and no interface peeling is caused by the rear surface grinding.

The semiconductor device 1 according to the second embodiment provides the same advantageous effect as the first embodiment, which is described above.

Third Embodiment

A semiconductor device 1 according to a third embodiment will now be described with reference to FIGS. 20 to 22.

Figure 20:
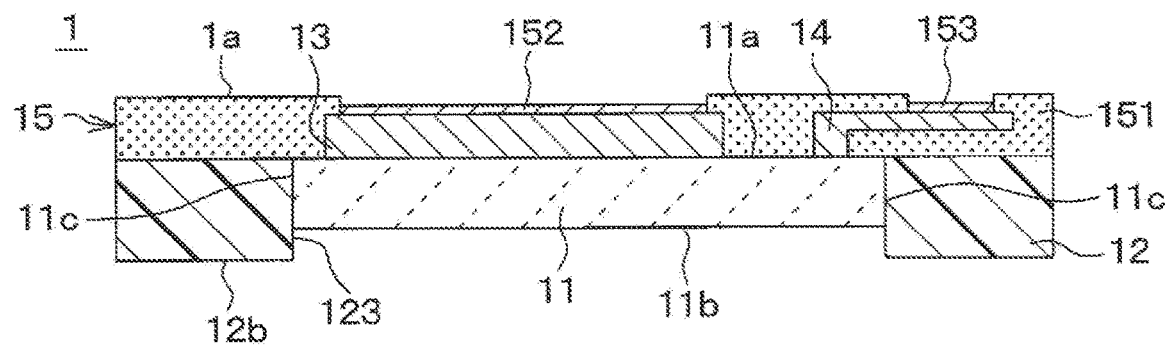
FIG. 20 is a cross-sectional view illustrating a configuration of a semiconductor device according to a third embodiment.

As shown, for example, in FIG. 20, the semiconductor device 1 according to the third embodiment does not include the conductive member 10, has a recessed section 123 formed on an opposite surface of the sealing member 12 that is positioned opposite the rewiring layer 15, and a part or whole of the rear surface 11b of the semiconductor element 11 is exposed from the sealing member 12 within the recessed section 123. The semiconductor device 1 according to the third embodiment differs as described above from the semiconductor device 1 according to the first embodiment, which is described above. The third embodiment is described below by mainly explaining the difference from the first embodiment.

The semiconductor device 1 according to the third embodiment is configured so that the opposite surface 12b of the sealing member 12, which is positioned opposite the rewiring layer 15, protrudes from the rear surface 11b of the semiconductor element 11, and that the opposite surface 12b has the recessed section 123, and further that the rear surface 11b of the semiconductor element 11 is exposed from the sealing member 12 within the recessed section 123. Since the opposite surface 12b of the sealing member 12 protrudes from the rear surface 11b of the semiconductor element 11, the boundary between the side surface 11c of the semiconductor element 11 and the sealing member 12 is not exposed to the grinding tool during the grinding of the sealing member 12. Therefore, the semiconductor device 1 is configured so as to suppress the occurrence of interface peeling at the boundary between the side surface 11c of the semiconductor element 11 and the sealing member 12.

[Manufacturing Method]

The semiconductor device 1 according to the third embodiment is manufactured by a manufacturing process illustrated, for example, in FIGS. 21A to 21D.

Figure 21A:
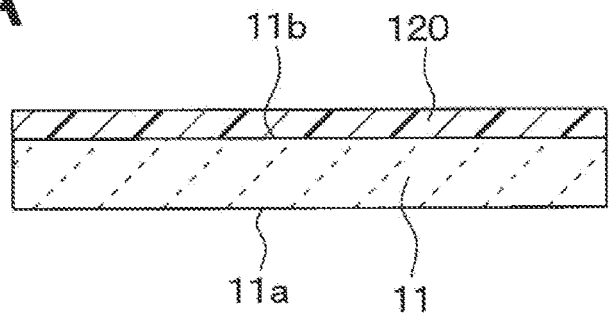
FIG. 21A is a cross-sectional view illustrating a part of a manufacturing process of the semiconductor device according to the third embodiment that is performed to form a rear surface protective member on a semiconductor element.

More specifically, as shown, for example, in FIG. 21A, the semiconductor element 11 is prepared, and the whole region of the rear surface 11b of the semiconductor element 11 is covered with a rear surface protective member 120. The rear surface protective member 120 is made of an appropriate material peelable after the formation of the sealing member 12, such as an adhesive material whose force of adhesion to the rear surface 11b of the semiconductor element 11 is reduced by ultraviolet irradiation or heating. The description given below relates to a representative example in which an adhesive material whose force of adhesion is reduced by ultraviolet irradiation is used as the rear surface protective member 120. In such a case, the rear surface protective member 120 usable may be, for example, an appropriate tape including an acrylic or silicone adhesive material that becomes hardened on a PVC, polyolefin, or other base material due to ultraviolet radiation.

Figure 21B:
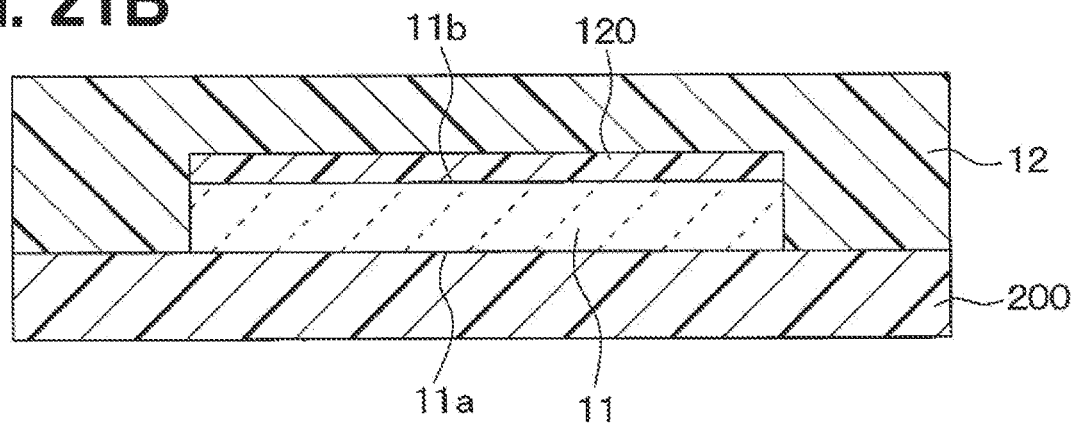
FIG. 21B is a cross-sectional view illustrating another part of the manufacturing process that is performed subsequently to the part illustrated in FIG. 21A.

Subsequently, as shown in FIG. 21B, the front surface 11a of the semiconductor element 11 is pasted on the support substrate 200, and the sealing member 12 covering the conductive member 10 and the rear surface protective member 120 is, for example, compression-molded or otherwise molded by using a mold (not shown).

Figure 21C:
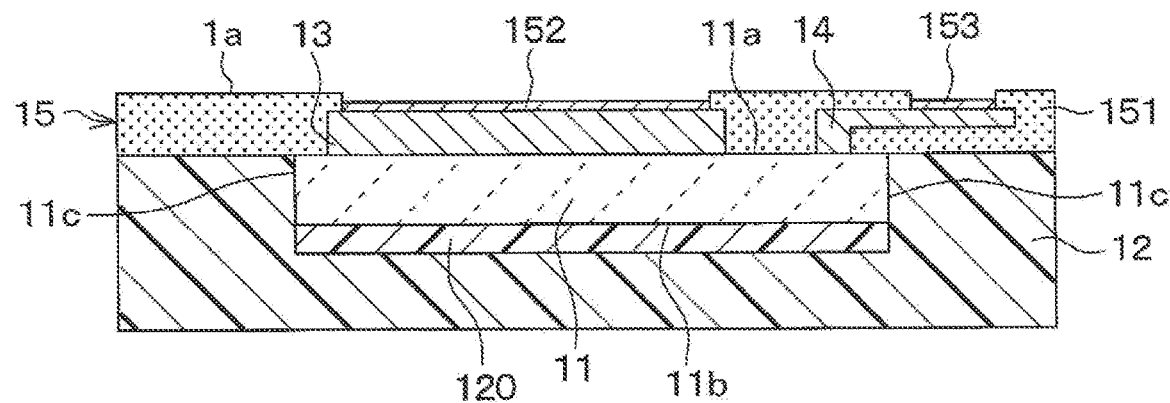
FIG. 21C is a cross-sectional view illustrating another part of the manufacturing process that is performed subsequently to the part illustrated in FIG. 21B.

Next, as shown in FIG. 21C, the rewiring layer 15 is formed on the side toward the front surface 11a of the semiconductor element 11, for example, by performing the same process as described in conjunction with the first embodiment, which is described above.

Figure 21D:
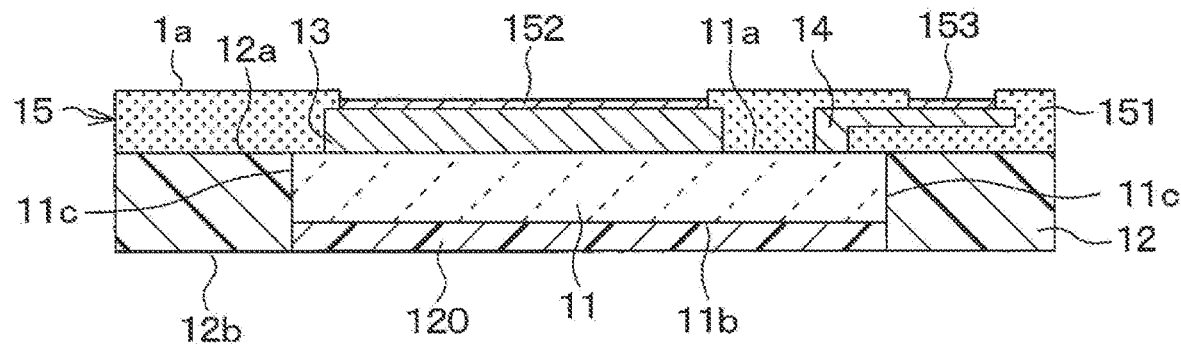
FIG. 21D is a cross-sectional view illustrating another part of the manufacturing process that is performed subsequently to the part illustrated in FIG. 21C.

Subsequently, a surface of the sealing member 12 that covers the rear surface protective member 120 is ground so as to expose the rear surface protective member 120 as shown in FIG. 21D. However, in order to prevent the sealing member 12 from being inadvertently ground to the rear surface 11b of the semiconductor element 11 during the grinding process for the sealing member 12, it is preferable that the thickness of the rear surface protective member 120 be such as but not limited to 60 µm or greater.

Figure 21E:
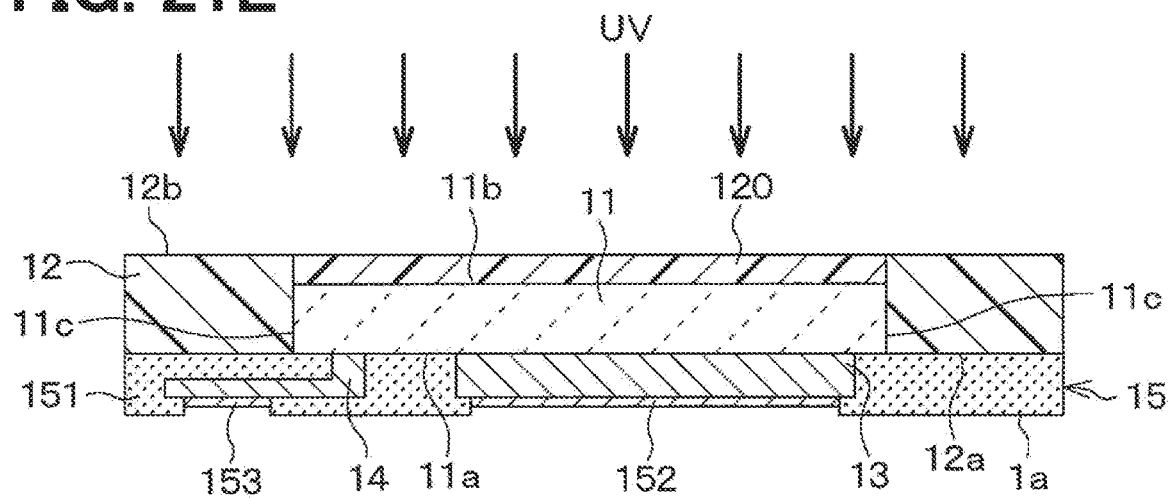
FIG. 21E is a cross-sectional view illustrating another part of the manufacturing process that is performed subsequently to the part illustrated in FIG. 21D.

Next, as indicated by arrows in FIG. 21E, the opposite surface 12b of the sealing member 12 is irradiated with ultraviolet (UV) rays to reduce the force of adhesion of the rear surface protective member 120 and thus reduce the adhesion between the rear surface protective member 120 and the rear surface 11b of the semiconductor element 11.

Finally, peeling off the UV-irradiated rear surface protective member 120 by using a dicing tape forms the sealing member 12 having the recessed section 123 that exposes the rear surface 11b of the semiconductor element 11 as shown in FIG. 20.

For example, the semiconductor device 1 can be manufactured by the above-described manufacturing method. Since the rear surface protective member 120 is peeled off to form the recessed section 123 and thus expose the rear surface 11b of the semiconductor element 11, the electrode formation process need not be performed on the rear surface 11b of the semiconductor element 11 after the grinding of the sealing member 12. Further, this semiconductor device 1 can be used to configure a semiconductor module having the same structure as described in conjunction with the first embodiment, which is described above. In such an instance, the joining material 5 is coated onto the recessed section 123 in order to join the rear surface 11b of the semiconductor element 11 to another member such as the heat dissipation member.

First Modification of Manufacturing Method

The rear surface protective member 120 may be peeled off by using an adhesive tape whose force of adhesion is reduced by ultraviolet rays (this adhesive tape is hereinafter referred to as the "UV tape").

Figure 22:
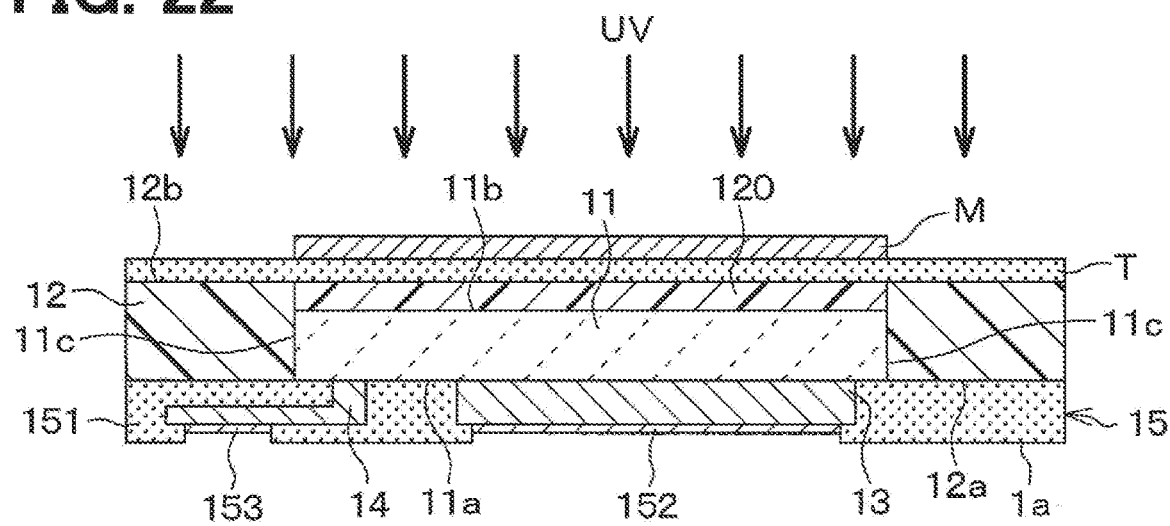
FIG. 22 is a cross-sectional view illustrating a process of ultraviolet irradiation in a case where the rear surface protective member is to be peeled by using a UV tape.

More specifically, as shown in FIG. 22, the UV tape T is attached to the opposite surface 12b of the sealing member 12 and to the rear surface protective member 120, and then a portion of the UV tape T that is attached to the rear surface protective member 120 is irradiated with ultraviolet rays by using a mask M. Subsequently, a dicing tape (not shown) is attached to the UV tape T, and then the rear surface protective member 120 is peeled off together with the UV tape T to obtain the semiconductor device 1 illustrated in FIG. 20. Consequently, the rear surface protective member 120 is peeled off by using the UV tape T, which is strongly stuck on the rear surface protective member 120 and weakly stuck on the sealing member 12. This reduces the load that is imposed on an area other than the rear surface protective member 120 by a peel force exerted by the dicing tape, and thus suppresses deformation of the semiconductor device 1. That is to say, the use of the UV tape T provides an advantageous effect of improving the yield in the manufacture of the semiconductor device 1 according to the third embodiment.

Second Modification of Manufacturing Method

The foregoing description relates to an example in which an adhesive material is used as the rear surface protective member 120 and the rear surface protective member 120 is peeled off by using a dicing tape. However, the manufacturing method is not limited to the one described above.

For example, the recessed section 123 may be formed by adopting the rear surface protective member 120 made of thermoplastic resin and removing the rear surface protective member 120 by dissolving it with a chemical solution after the grinding of the sealing member 12. For example, when the rear surface protective member 120 made of polybutadiene is used in this case, the chemical solution to be used for dissolving and removing the rear surface protective member 120 is a solvent that does not dissolve the sealing member 12 but dissolves polybutadiene. For example, a chemical solution having a solubility parameter value (SP value) close to that of polybutadiene (8.1 to 8.6), such as toluene (8.9), dimethyl ether (8.8), or epoxy (10.9), may be used as the chemical solution for dissolving and removing the rear surface protective member 120.

In the above case, the rear surface protective member 120 can be thermocompression-bonded to the rear surface 11b of the semiconductor element 11 illustrated in FIG. 21A.

When the above-described method is adopted, no physical force is exerted on the sealing member 12 during removal of the rear surface protective member 120. Therefore, the use of the above-described method provides an advantageous effect of suppressing deformation of the semiconductor device 1 and improving the yield in the manufacture of the semiconductor device 1.

Third Modification of Manufacturing Method

The rear surface protective member 120 may be an appropriate material whose force of adhesion to the rear surface 11b of the semiconductor element 11 is reduced by heating.

In this case, a material used as the rear surface protective member 120 has characteristics such that the force of adhesion decreases at a temperature higher than the heating temperature applied to the rear surface protective member 120 for peeling the rear surface protective member 120 from the support substrate 200 after the molding of the sealing member 12. For example, in a case where the workpiece is peeled from the support substrate 200 at a temperature of 190° C. after the molding of the sealing member 12, a material whose force of adhesion decreases at a temperature higher than 190° C. can be used as the rear surface protective member 120. In such a case, for example, REVALPHA (registered trademark) 3195V, which is manufactured by NITTO DENKO CORPORATION and peelable at 190° C., can be used as the adhesive material for the support substrate 200. Further, REVALPHA (registered trademark) 3195E, which is manufactured by NITTO DENKO CORPORATION and peelable at 230° C., can be used as the rear surface protective member 120. However, the above-mentioned materials are merely examples. Other publicly known materials may be used. Moreover, the peeling temperature may also be changed as appropriate.

From the viewpoint of suppressing the warpage of the semiconductor element 11, it is preferable that the rear surface protective member 120 be formed of a material having low elasticity. The reason is that generation of internal stress of the semiconductor element 11, which causes the warpage after peeling, is suppressed by hindering the semiconductor element 11 from warping due to heating during peeling.

When the above-described method is adopted, no physical force is exerted on the sealing member 12 during peeling of the rear surface protective member 120. Therefore, the use of the above-described method provides an advantageous effect of suppressing the deformation of the semiconductor device 1 and improving the yield in the manufacture of the semiconductor device 1.

The semiconductor device 1 according to the third embodiment provides the same advantageous effect as the first embodiment, which is described above. Further, since the semiconductor device 1 according to the third embodiment has the recessed section 123, the thickness of the joining material 5 is equivalent to or greater than the depth of the recessed section 123 in a case where the rear surface 11b of the semiconductor element 11, which is included in the semiconductor device 1, is joined to another member by using the joining material 5. This additionally provides an advantageous effect of allowing the joining material 5 to have a predetermined or greater thickness. Moreover, in a case where, for example, a solder foil is used as the joining material 5, the recessed section 123 can be provided beforehand with the solder foil and then assembled with another member. This provides an advantageous effect of eliminating the necessity of positioning the joining material 5 at the time of assembling.

First Modification of Third Embodiment

Figure 23:
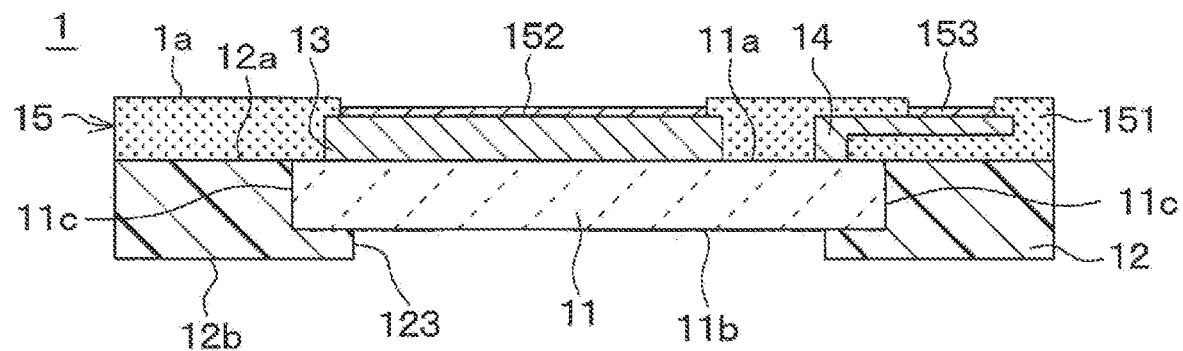
FIG. 23 is a cross-sectional view illustrating a semiconductor device according to a first modification of the third embodiment.

The recessed section 123 need not always have the same external shape as the semiconductor element 11 as shown in FIG. 20. For example, as shown in FIG. 23, the recessed section 123 may be smaller in plane size than the rear surface 11b of the semiconductor element 11 and formed so as to fit inside the outline of the rear surface 11b of the semiconductor element 11.

The semiconductor device 1 according to the first modification of the third embodiment is configured such that the boundary between the side surface 11c of the semiconductor element 11 and the sealing member 12 is covered with the sealing member 12. Therefore, this semiconductor device 1 is configured so as to reduce the force applied to the boundary during the grinding of the sealing member 12 as compared with the semiconductor device 1 according to the third embodiment, which is described above.

Further, in the above case, a portion of the sealing member 12 that covers the rear surface 11b is an "overhang" that projects toward the rear surface 11b of the semiconductor element 11. The overhang holds the semiconductor element 11 to stabilize the interfacial adhesion between the side surface 11c of the semiconductor element 11 and the sealing member 12. Moreover, in a case where silicon wafers are used to manufacture a plurality of the semiconductor devices 1 at a time, the overhang additionally plays a role of suppressing chip skipping and wafer breakage during the grinding of the sealing member 12 and during dicing by holding the semiconductor element 11.

The present modification not only provides the same advantageous effect as the third embodiment, which is described above, but also provides an advantageous effect of suppressing chip skipping and wafer breakage when a plurality of the semiconductor devices 1 are manufactured at a time.

Second Modification of Third Embodiment

Figure 24:
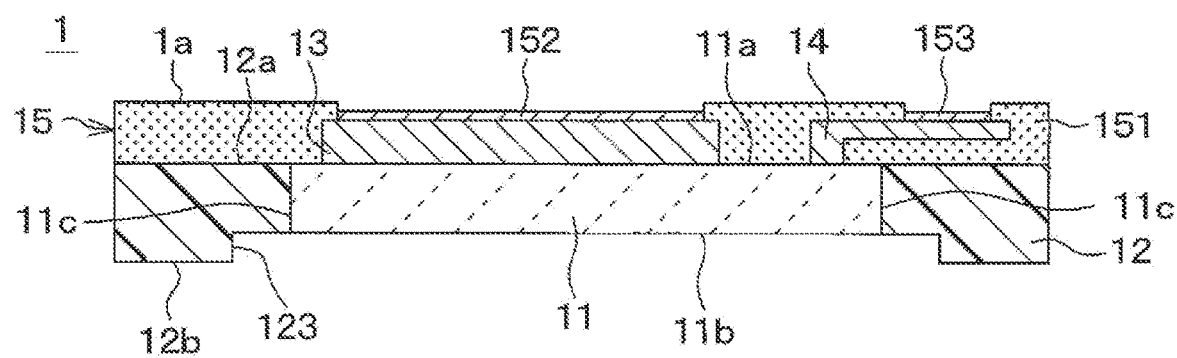
FIG. 24 is a cross-sectional view illustrating a semiconductor device according to a second modification of the third embodiment.

As shown, for example, in FIG. 24, the recessed section 123 may be larger in plane size than the rear surface 11b of the semiconductor element 11 and formed so as to fit the rear surface 11b of the semiconductor element 11 into the recessed section 123. That is to say, the recessed section 123 may be formed so that a stepped section of the opposite surface 12b of the sealing member 12, which is provided by the recessed section 123, is positioned outside the outline of the rear surface 11b of the semiconductor element 11.

The semiconductor device 1 according to the second modification of the third embodiment is configured to provide improved heat dissipation. The reason is that, when, for example, a heat dissipation member is joined to the rear surface 11b of the semiconductor element 11 through the joining material 5, heat of the semiconductor element 11 is dispersed more extensively by the joining material 5 filled into the recessed section 123. That is to say, the semiconductor device 1 according to the present modification has a structure suitable for configuring a semiconductor module provided with high heat dissipation.

The present modification not only provides the same advantageous effect as the third embodiment, which is described above, but also provides an advantageous effect of providing the semiconductor element 11 implemented in the semiconductor device 1 with improved heat dissipation.

Fourth Embodiment

A semiconductor device 1 according to a fourth embodiment will now be described with reference to FIGS. 25 to 26D.

Figure 25:
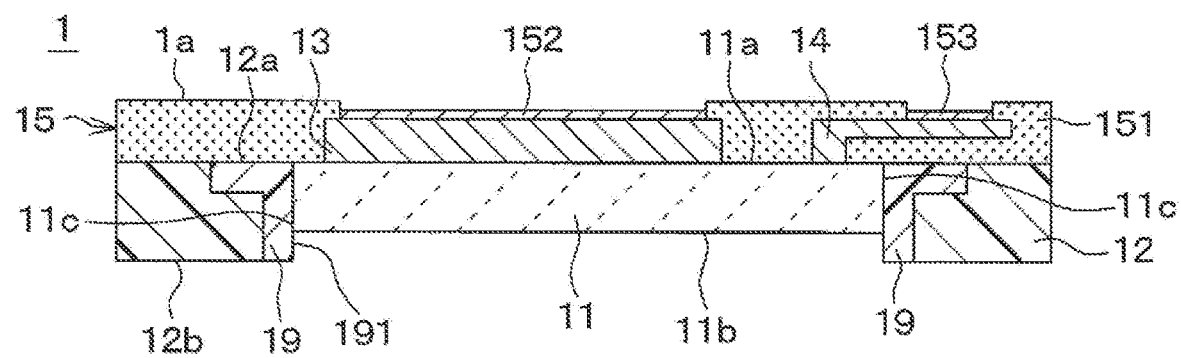
FIG. 25 is a cross-sectional view illustrating a configuration of a semiconductor device according to a fourth embodiment.

As shown, for example, in FIG. 25, the semiconductor device 1 according to the fourth embodiment differs from the semiconductor device 1 according to the third embodiment, which is described above, in that the former includes a frame-shaped covering section 19. The frame-shaped covering section 19 has a substantially frame shape and covers the side surface 11c of the semiconductor element 11. The fourth embodiment is described below by mainly explaining the difference from the third embodiment.

In the fourth embodiment, the semiconductor element 11 is configured so that the side surface 11c is covered with the frame-shaped covering section 19 while the rear surface 11b is exposed to the outside without being covered with the frame-shaped covering section 19.

The frame-shaped covering section 19 is formed, for example, of polyimide, polyamide, butyl acetate, or other insulating material that is more adherent to the semiconductor element 11 than the sealing member 12. As shown in FIG. 25, the frame-shaped covering section 19 has a greater dimension in the thickness direction than the semiconductor element 11, and is substantially shaped like a cylinder having a flange part protruding in the membrane plane direction on the side toward the rewiring layer 15. The frame-shaped covering section 19 has the same thickness as the sealing member 12, and includes an opening 191 that exposes the rear surface 11b of the semiconductor element 11 to the outside. The opening 191 corresponds to the recessed section 123 in the third embodiment, which is described above.

The frame-shaped covering section 19 covers the rear surface 11b and side surface 11c of the semiconductor element 11 while the sealing member 12 is formed and ground during the manufacturing process for the semiconductor device 1, which is described later, and plays a role of protecting the rear surface 11b of the semiconductor element 11 during the grinding of the sealing member 12. The frame-shaped covering section 19 becomes shaped as described above when a portion covering the rear surface 11b of the semiconductor element 11 is removed after the grinding of the sealing member 12.

The semiconductor device 1 according to the fourth embodiment is manufactured by a manufacturing process illustrated, for example, in FIGS. 26A to 26D.

Figure 26A:
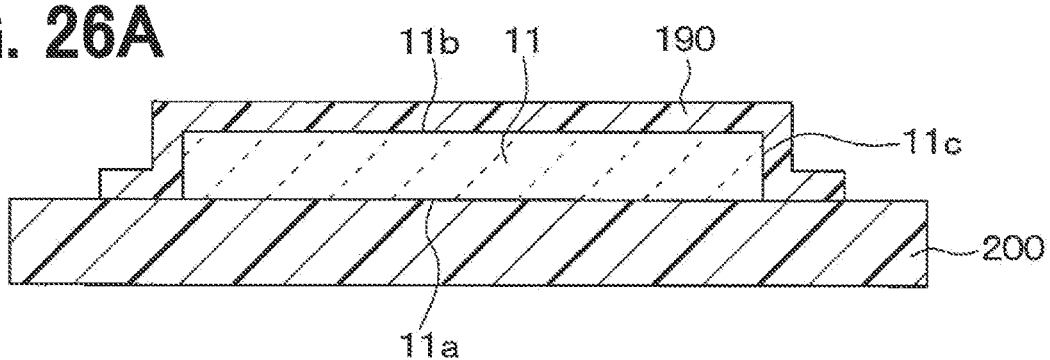
FIG. 26A is a cross-sectional view illustrating a part of a manufacturing process of the semiconductor device according to the fourth embodiment that is performed to temporarily fix the semiconductor element to a support substrate by using a temporary fixing material.

First of all, as shown, for example, in FIG. 26A, the front surface 11a of the semiconductor element 11 is pasted on the support substrate 200, and then a resin sheet 190 made, for example, of polyimide is pasted on the semiconductor element 11. This not only protects the semiconductor element 11 by covering the rear surface 11b and the side surface 11c with the resin sheet 190, but also suppresses chip lifting from the support substrate 200 and positional displacement on the support substrate 200.

Figure 26B:
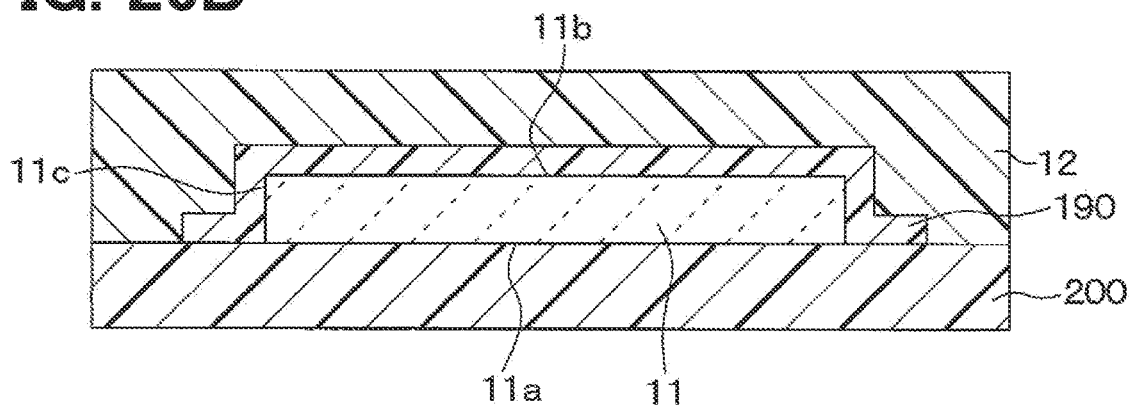
FIG. 26B is a cross-sectional view illustrating another part of the manufacturing process that is performed subsequently to the part illustrated in FIG. 26A.

Subsequently, as shown, for example, in FIG. 26B, a mold (not shown) is prepared, and the sealing member 12 covering the semiconductor element 11 together with the resin sheet 190 is compression-molded or otherwise molded by using the prepared mold. Then, the workpiece is peeled from the support substrate 200 by an appropriate method, such as heating, in order to expose the front surface 11a of the semiconductor element 11 to the outside.

Figure 26C:
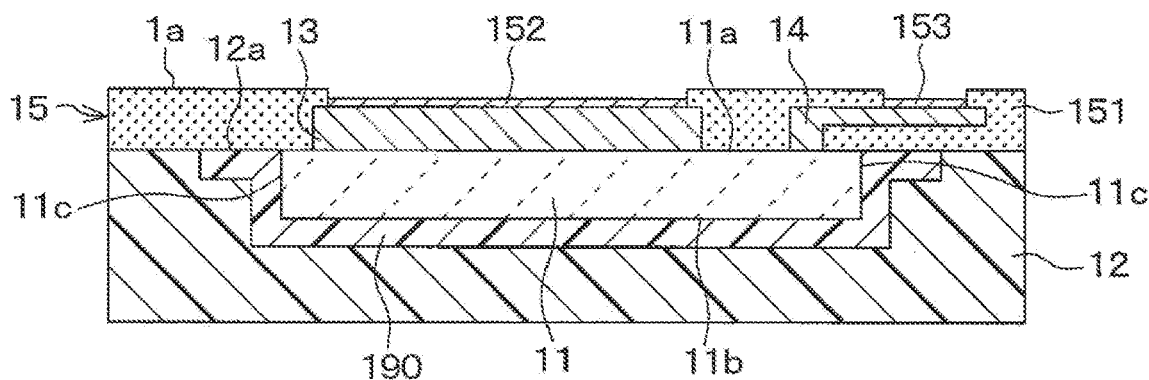
FIG. 26C is a cross-sectional view illustrating another part of the manufacturing process that is performed subsequently to the part illustrated in FIG. 26B.
Figure 26D:
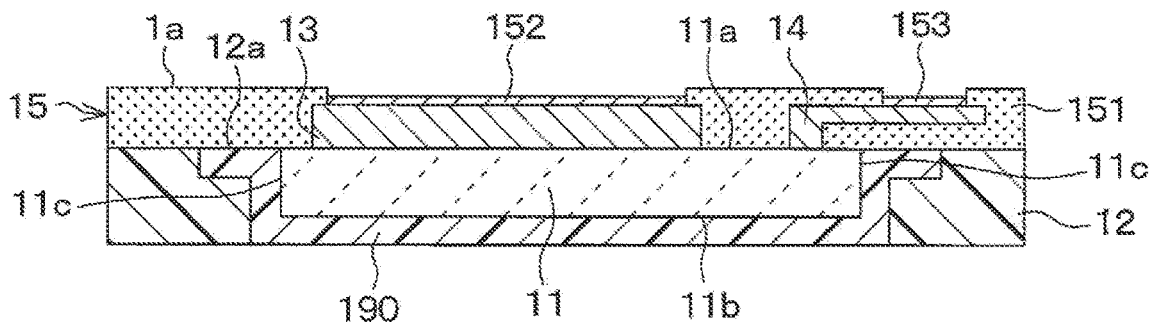
FIG. 26D is a cross-sectional view illustrating another part of the manufacturing process that is performed subsequently to the part illustrated in FIG. 26C.

Next, as shown, for example, in FIG. 26C, the rewiring layer 15 covering the front surface of the semiconductor element 11, a part of the frame-shaped covering section 19, and one surface 12a of the sealing member 12 is formed by the same process as described in conjunction with the first embodiment, which is described above.

Subsequently, as shown, for example, in FIG. 26D, a portion of the resin sheet 190 that covers the rear surface 11b of the semiconductor element 11 is exposed from the sealing member 12 by using a grinder or other grinding tool to grind the sealing member 12 from a surface of the sealing member 12 that covers the resin sheet 190.

Finally, the opening 191, which exposes the rear surface 11b of the semiconductor element 11 to the outside, is formed by removing a portion of the resin sheet 190 that covers the rear surface 11b of the semiconductor element 11 through the use of an appropriate method, such as photolithography etching or laser machining.

The semiconductor device 1 can be manufactured by the manufacturing method described above. Since the above-described manufacturing method uses the resin sheet 190 to protect the rear surface 11b of the semiconductor element 11 during the grinding of the sealing member 12, it is not necessary to perform the process of forming an electrode on the rear surface 11b after the grinding of the sealing member 12. Further, since a portion of the resin sheet 190 that covers the rear surface 11b of the semiconductor element 11 is selectively removed by an appropriate etching method, physical force is unlikely to be applied to the boundary between the side surface 11c of the semiconductor element 11 and the frame-shaped covering section 19. Moreover, since the frame-shaped covering section 19 is formed of a resin material more adherent to the semiconductor element 11 than the sealing member 12, improved interfacial adhesion is provided between the side surface 11c of the semiconductor element 11 and the frame-shaped covering section 19. This suppresses the occurrence of peeling at the interface between the side surface 11c of the semiconductor element 11 and the frame-shaped covering section 19.

The fourth embodiment provides the same advantageous effect as the third embodiment, which is described above. Further, since the semiconductor element 11 is mounted on the support substrate 200 and then covered with the resin sheet 190, chip lifting and positional displacement are suppressed to provide an additional advantageous effect of improving the yield in the manufacture of the semiconductor device 1.

In a case where a plurality of the semiconductor devices 1 according to the fourth embodiment are to be manufactured at a time, the resin sheet 190 is pasted so as to cover all of the plurality of semiconductor elements 11 mounted on the support substrate 200. In such a case, the flange part of the frame-shaped covering section 19 is extended to the end face of the semiconductor device 1 along the membrane plane of the rewiring layer 15.

Fifth Embodiment

A semiconductor device 1 according to a fifth embodiment will now be described with reference to FIGS. 27 to 29F.

Figure 27:
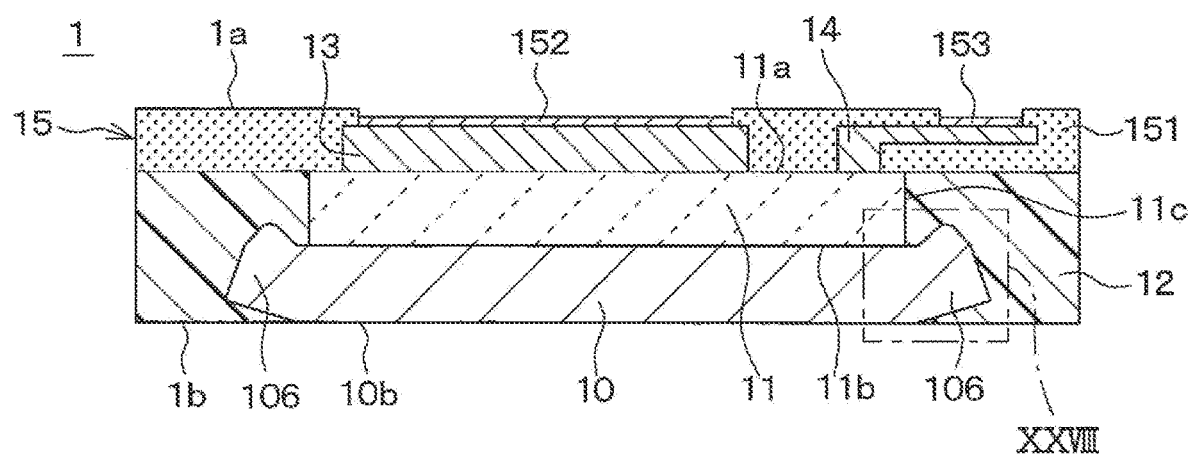
FIG. 27 is a cross-sectional view illustrating a configuration of a semiconductor device according to a fifth embodiment.
Figure 28:
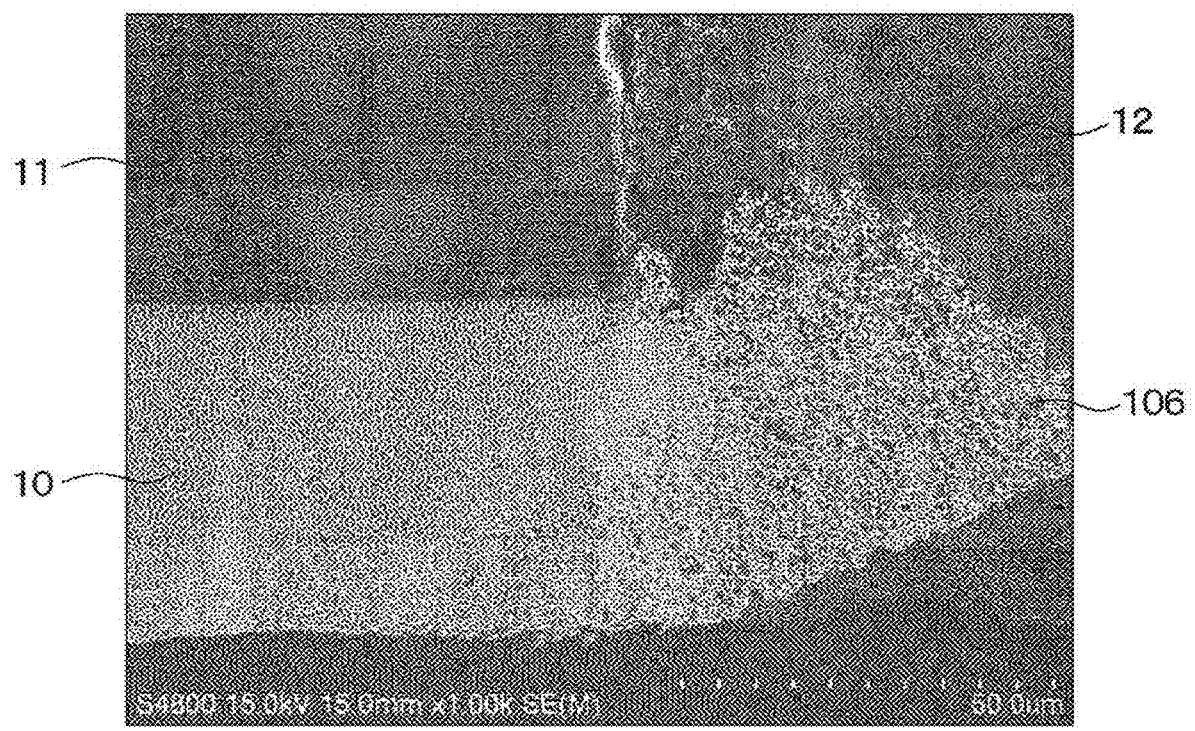
FIG. 28 is a scanning electron microscope (SEM) image of the XXVIII region in FIG. 27.

As shown, for example, in FIG. 27, the semiconductor device 1 according to the fifth embodiment differs from the semiconductor device 1 according to the first embodiment, which is described above, in that a projecting portion 106 of the conductive member 10 covering the rear surface 11b of the semiconductor element 11 and positioned outside the outline of the semiconductor element 11 has a porous structure having a lower density than the other parts of the conductive member 10. The fifth embodiment is described below by mainly explaining the difference from the first embodiment.

The conductive member 10 in the fifth embodiment is formed, for example, of a metal sintered body. Here, the "metal sintered body" is mainly composed of at least a conductive metal material, and has a later-described low-density porous structure at a certain portion to which a predetermined pressure is not applied. The metal sintered body may be, for example, sintered silver mainly composed of silver or sintered copper mainly composed of copper. However, the metal sintered body is not limited to such materials. The following description of the fifth embodiment relates to a representative example in which the conductive member 10 is made of sintered silver.

The conductive member 10 in the present embodiment is larger in plane size than the semiconductor element 11 and disposed to cover the whole region of the rear surface 11b of the semiconductor element 11. As shown in FIG. 27, the conductive member 10 is configured so that the lower surface 10b inside the outline of the semiconductor element 11, namely, a region positioned directly below, is exposed to the outside. Meanwhile, the projecting portion 106 is assumed to be a portion of the conductive member 10 that is positioned outside the outline of the semiconductor element 11, and a region of the lower surface 10b that is positioned on the projecting portion 106 is partly tilted toward the semiconductor element 11 and covered with the sealing member 12.

The projecting portion 106 has a porous structure having a lower density than a remaining portion of the conductive member 10 other than the projecting portion 106. More specifically, as shown, for example, in FIG. 28, the projecting portion 106 is a porous body having voids of micrometer order or less, that is, a plurality of micropores, and has the lower density than the remaining portion of the conductive member 10. The reason is that the projecting portion 106 is a burr formed as an unpressurized region by sticking a part of constituent materials of the conductive member 10 out from the outline of the semiconductor element 11 in a process of forming the conductive member 10. The process of forming the conductive member 10 will be described later.

The projecting portion 106 is configured so that a larger number of micropores are formed and extend to the outermost surface of the projecting portion 106, and that the sealing member 12 has entered the micropores. The micropores of the projecting portion 106 are configured so that the opening positioned on the outermost surface of the projecting portion 106 has a minimum width of at least 10 nm in order to permit the entry of a resin material included in the sealing member 12 during the formation of the sealing member 12. This produces an anchoring effect to increase the force of adhesion between the projecting portion 106 and the sealing member 12, and thus suppresses the occurrence of interface peeling at the boundary between the projecting portion 106 and the sealing member 12, which begins from the side toward the lower surface 10b of the conductive member 10. Further, the projecting portion 106 has surface irregularities of micrometer order, that is, microscopic surface irregularities, and thus not only allows the micropores to produce the anchoring effect but also produces the anchoring effect by causing the sealing member 12 to follow the microscopic surface irregularities. As a result, the semiconductor device 1 according to the present embodiment is configured so as to suppress the occurrence of interface peeling at the boundary between the side surface 11c of the semiconductor element 11 and the sealing member 12 and provide enhanced reliability.

Meanwhile, an underneath section of the conductive member 10 that is positioned directly below the semiconductor element 11 when viewed from the top is a region of constituent materials of the conductive member 10 that is pressurized through the semiconductor element 11 during the process of forming the conductive member 10. Therefore, as shown, for example, in FIG. 28, the underneath section of the conductive member 10 is densified to have a smaller number of voids and a higher density than the projecting portion 106.

[Manufacturing Method]

The method for manufacturing the semiconductor device 1 according to the present embodiment will now be described with reference to FIGS. 29A to 29F. The description given below mainly relates to a process that differs from a process performed in conjunction with the first embodiment, which is described above.

Figure 29A:
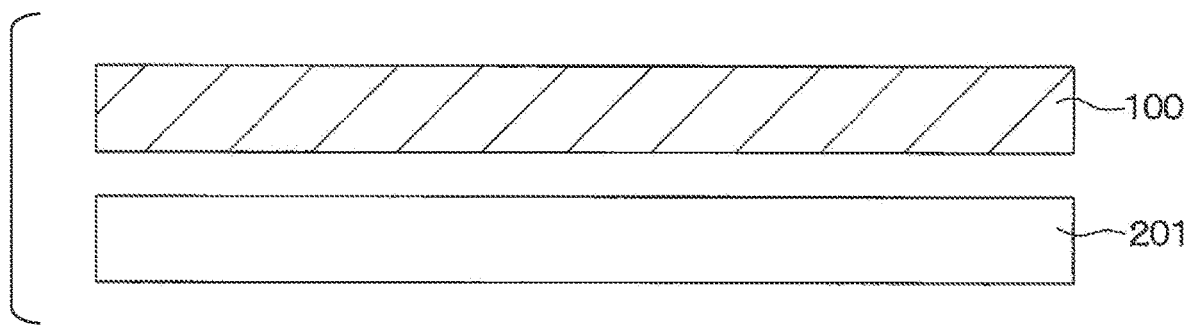
FIG. 29A is a cross-sectional view illustrating a part of a manufacturing process for the semiconductor device according to the fifth embodiment that is performed to prepare constituents and underlay of a conductive member.

First of all, as shown, for example, in FIG. 29A, a conductive sheet 100 and a base sheet 201 are prepared. The conductive sheet 100 is to be included later in the conductive member 10. The base sheet 201 acts as an underlay for the conductive sheet 100. The conductive sheet 100 may be made, for example, of film including sinterable metal microparticles such as silver nanoparticles or silver microparticles. The base sheet 201 to be used should be a sheet material (e.g., a silicone rubber sheet) formed of a resin material such as rubber, and able to withstand the temperature of a later-described punching process.

The conductive sheet 100 is, for example, assumed to have a thickness of approximately 10 μm to 100 μm and an elastic modulus of approximately 20 GPa to 80 GPa. The base sheet 201 is, for example, assumed to have a thickness of approximately 0.1 mm to 1 mm and an elastic modulus of approximately 5 MPa.

Figure 29B:
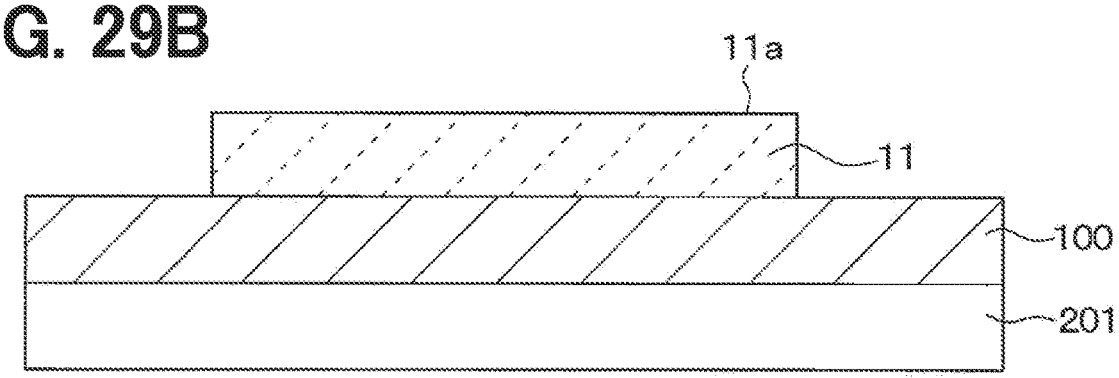
FIG. 29B is a cross-sectional view illustrating another part of the manufacturing process that is performed subsequently to the part illustrated in FIG. 29A.

Subsequently, as shown, for example, in FIG. 29B, the conductive sheet 100 is overlaid on the base sheet 201, and then a separately prepared semiconductor element 11 is mounted on the conductive sheet 100. For ease of understanding of the process, the following description is given with reference to a representative example in which one semiconductor element 11 is mounted on the conductive sheet 100. However, the manufacturing method is not limited to the one described as the representative example. A plurality of the semiconductor devices 1 may be manufactured at a time.

Figure 29C:
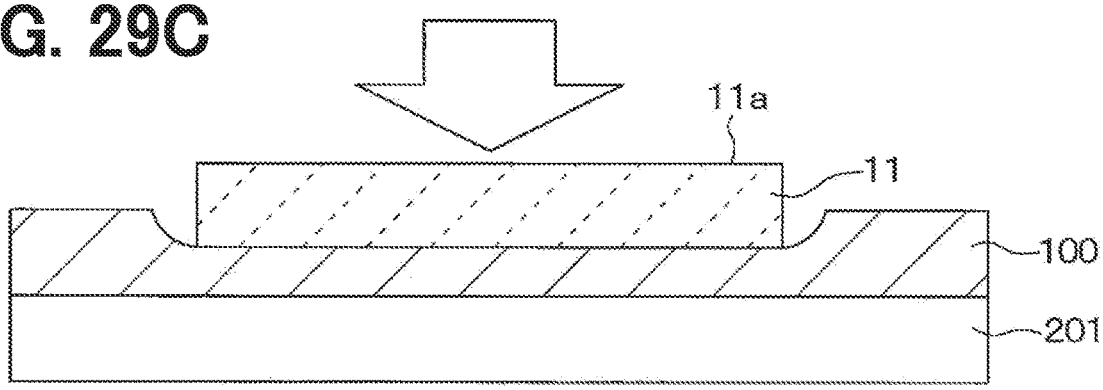
FIG. 29C is a cross-sectional view illustrating another part of the manufacturing process that is performed subsequently to the part illustrated in FIG. 29B.
Figure 29D:
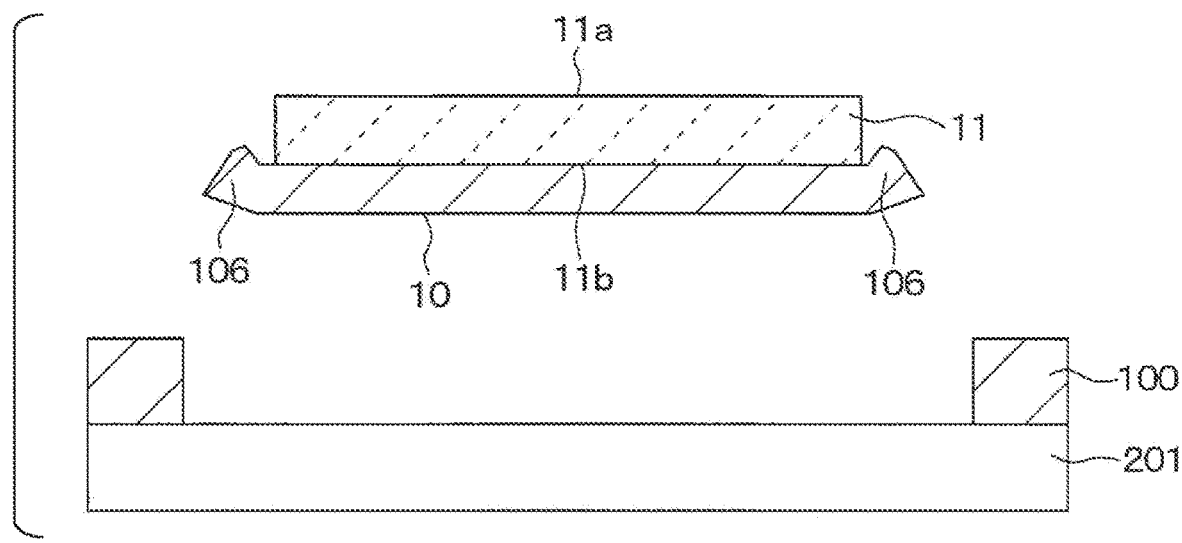
FIG. 29D is a cross-sectional view illustrating another part of the manufacturing process that is performed subsequently to the part illustrated in FIG. 290.

Next, as shown, for example, in FIG. 29C, a pressurization mechanism (not shown) is used to apply pressure from the side toward the front surface 11a of the semiconductor element 11 for the purpose of pressing against a part of the conductive sheet 100. This results in elastically deforming a portion of the base sheet 201 that includes a region positioned directly below the semiconductor element 11. Therefore, the conductive sheet 100 is subjected to shear force that is applied between an underneath section positioned directly below the semiconductor element 11 and a section adjacent to the underneath section. As a result, as shown in FIG. 29D, the underneath section of the conductive sheet 100, which is positioned directly below the semiconductor element 11, and a section around the underneath section are punched out and transferred to the semiconductor element 11.

The above-mentioned punching process can be performed in the atmosphere at a temperature of 100° C. to 200° C. and at a pressure of 1 MPa to 5 MPa. However, for example, the temperature and the pressure may be changed as appropriate depending on the materials of the conductive sheet 100 and base sheet 201. Further, when the punching process is performed, a part of the lower surface 10b of the conductive member 10 that is positioned on the projecting portion 106 is tilted toward the semiconductor element 11, that is, tilted upward.

Subsequently, for example, the semiconductor element 11 and the transferred conductive material are heated on a heating stage (not shown) at a firing temperature of 200° C. to 300° C. in order to sinter the conductive material. This causes the projecting portion 106 to have a porous structure with a large number of micropores, and forms the conductive member 10 whose underneath section positioned directly below the semiconductor element 11 is more densified than the projecting portion 106. Further, this sintering process joins the conductive member 10 to the rear surface 11b of the semiconductor element 11.

Figure 29E:
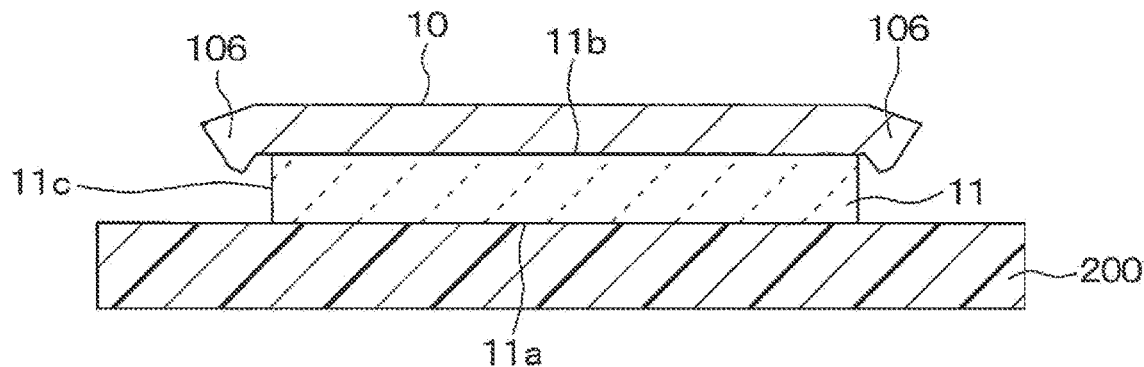
FIG. 29E is a cross-sectional view illustrating another part of the manufacturing process that is performed subsequently to the part illustrated in FIG. 29D.

Next, as shown, for example, in FIG. 29E, the front surface 11a of the semiconductor element 11 is pasted on the support substrate 200 to retain the semiconductor element 11 to which the conductive member 10 is joined.

Figure 29F:
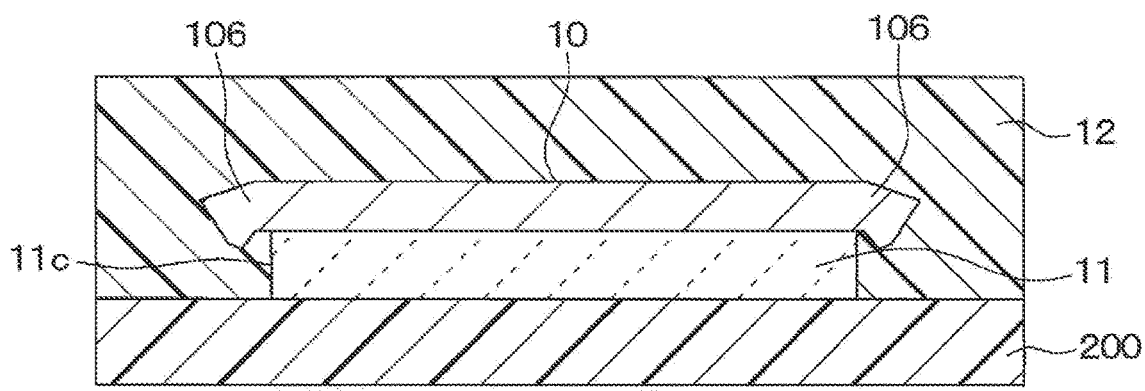
FIG. 29F is a cross-sectional view illustrating another part of the manufacturing process that is performed subsequently to the part illustrated in FIG. 29E.

Next, a mold (not shown) is prepared, the semiconductor element 11 retained by the support substrate 200 is covered with a resin material, such as epoxy resin, for example, by compression molding, and the resin material is hardened, for example, by heating to mold the sealing member 12 as shown in FIG. 29F. As a result, the side surface 11c of the semiconductor element 11 and the conductive member 10 are covered with the sealing member 12. Particularly, the projecting portion 106 of the conductive member 10, which has a large number of micropores, is more closely adhered to the sealing member 12 than the other parts of the conductive member 10 due to the anchoring effect.

Subsequently, the semiconductor device 1 according to the present embodiment can be manufactured by performing the same process as for the semiconductor device 1 according to the first embodiment, which is described above and illustrated, for example, in FIGS. 3D to 3J. When the manufacturing method according to the present embodiment is used, the process of forming the conductive member 10 forms a region closely adhered to the sealing member 12, that is, the projecting portion 106. Therefore, unlike the third to sixth modifications of the first embodiment, which are described above, a process of forming a region for suppressing the extension of interface peeling at the boundary between the conductive member 10 and the sealing member 12 or a process of forming a region closely adhered to the sealing member 12 need not be performed in addition to the process of forming the conductive member 10. This simplifies the manufacturing process. Consequently, the semiconductor device 1 according to the present embodiment is configured so as to make the manufacturing cost lower than the semiconductor device 1 according to the third to sixth modifications of the first embodiment, which are described above.

As is the case with the first embodiment, which is described above, the present embodiment is configured such that the boundary between the side surface 11*c* of the semiconductor element 11 and the sealing member 12 is covered with the conductive member 10. Therefore, the semiconductor device 1 is configured so as to reduce the force applied to the boundary during the grinding process for the sealing member 12. Consequently, the present embodiment provides the same advantageous effect as the first embodiment, which is described above. Further, since the projecting portion 106 of the conductive member 10 is a porous body, the sealing member 12 enters the porous body to produce the anchoring effect. This increases the force of adhesion between the sealing member 12 and the projecting portion 106, and thus provides an advantageous effect of further suppressing the occurrence of interface peeling at the boundary between the side surface 11*c* of the semiconductor element 11 and the sealing member 12.

Figure 30:
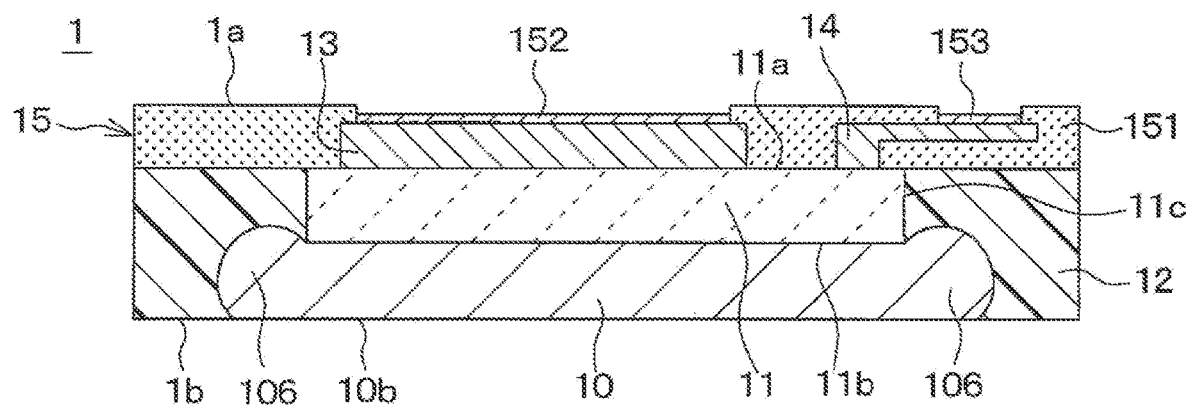
FIG. 30 is a cross-sectional view illustrating another configuration of the semiconductor device according to the fifth embodiment.

The above description relates to an example in which the conductive sheet 100 and the base sheet 201 are used to perform a punching and transfer process so as to form the conductive member 10. However, the formation of the conductive member 10 is not limited to such a process. Alternatively, the conductive member 10 may be formed, for example, by performing dispenser coating of sinterable paste material made of metal microparticles such as silver nanoparticles, mounting the semiconductor element 11 on the coated silver paste, pressurizing the conductive member 10 through the semiconductor element 11, and then sintering the pressurized conductive member 10. In this case, as shown, for example, in FIG. 30, the lower surface 10*b* of the conductive member 10 is entirely flattened and exposed from the sealing member 12. However, there is no particular issue because the projecting portion 106 and the sealing member 12 are closely adhered to each other. That is to say, in the present embodiment, the projecting portion 106 of the conductive member 10 should at least be a porous body having lower density than the underneath section of the conductive member 10. The external shape of the conductive member 10 may vary depending on the manufacturing process.

Other Embodiments

Although the present disclosure has been described with reference to the foregoing embodiments, it is to be understood that the present disclosure is not limited to the foregoing embodiments and the structures described in conjunction with the foregoing embodiments. The present disclosure extends to the various modifications and other modifications within the scope of equivalency thereof. Further, various combinations and aspects as well as other combinations and aspects including one of such elements or more than one of such elements are intended to be included within the scope of the present disclosure and the scope of the technical ideas of the present disclosure.

Figure 31:
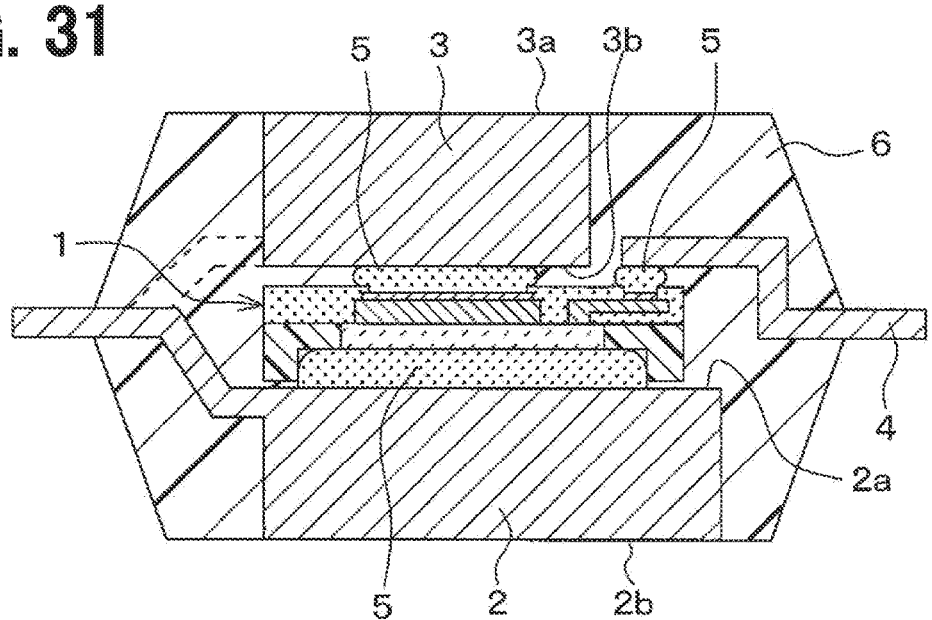
FIG. 31 is a cross-sectional view illustrating an example of a semiconductor module that uses the semiconductor device according to the third embodiment.

For example, in the second to fifth embodiments, which are described above, the roughened section 111 may be formed on the side surface 11*c* of the semiconductor element 11. Further, not only the semiconductor device 1 according to the first embodiment, which is described above, but also the semiconductor device 1 according to an embodiment other than the first embodiment may be used to configure a semiconductor module. Even in a case where the semiconductor device 1 according to the third embodiment is used to configure a semiconductor module as shown, for example, in FIG. 31, the semiconductor module is configured to not only suppress the interface peeling of the side surface 11*c* of the semiconductor element 11 but also become thinned and provide high heat dissipation.

What is claimed is:

1. A semiconductor device comprising:
a semiconductor element having a front surface, a rear surface positioned opposite the front surface, and a side surface connecting the front surface and the rear surface;
a conductive member having an upper surface that is joined to the rear surface of the semiconductor element and a lower surface that is opposite the upper surface;
a sealing member covering the side surface of the semiconductor element and a part of the conductive member; and
a rewiring layer including an insulating layer, a first electrode, a second electrode, a first externally-exposed layer, and second externally-exposed layer,
the insulating layer covering the front surface of the semiconductor element and a part of the sealing member,
the first electrode and the second electrode being connected to the semiconductor element,
the first externally-exposed layer being conductive and covering a portion of the first electrode that is exposed from the insulating layer,
the second externally-exposed layer being conductive and covering a portion of the second electrode that is exposed from the insulating layer, wherein
an end of the second electrode that is positioned opposite the semiconductor element is extended to a portion of the rewiring layer that is positioned outside an outline of the semiconductor element,
the second externally-exposed layer covers a portion of the second electrode that is positioned outside the outline of the semiconductor element,
the rear surface of the semiconductor element is entirely positioned inside an outline of the conductive member,
a plane size of the conductive member along the rear surface of the semiconductor element is larger than the rear surface of the semiconductor element,
the conductive member is formed of a metal sintered body,
the lower surface of the conductive member is exposed from the sealing member, the conductive member includes a projecting portion that is positioned outside the outline of the semiconductor element, the projecting portion has a plurality of voids of micrometer order or less, the plurality of voids extends at least to an outermost surface of the projecting portion, and the projecting portion has a lower density than a remaining portion of the conductive member other than the projecting portion.

2. The semiconductor device according to claim 1, wherein the semiconductor element includes a roughened section, the roughened section has surface irregularities of micrometer order or less and is positioned on the side surface connecting the front surface to the rear surface.

3. A semiconductor device comprising:

a semiconductor element having a front surface, a rear surface positioned opposite the front surface, and a side surface connecting the front surface and the rear surface;

a sealing member covering the side surface of the semiconductor element; and a rewiring layer including an insulating layer, a first electrode, a second electrode, a first externally-exposed layer, and a second externally-exposed layer, the insulating layer covering the front surface of the semiconductor element and a part of the sealing member, the first electrode and the second electrode being connected to the semiconductor element, the first externally-exposed layer being conductive and covering a portion of the first electrode that is exposed from the insulating layer, the second externally-exposed layer being conductive and covering a portion of the second electrode that is exposed from the insulating layer, wherein an end of the second electrode that is positioned opposite the semiconductor element is extended to a portion of the rewiring layer that is positioned outside an outline of the semiconductor element, the second externally-exposed layer covers a portion of the second electrode that is positioned outside the outline of the semiconductor element, the sealing member has one surface covered with the rewiring layer and an opposite surface positioned opposite the one surface, the opposite surface of the sealing member projects from the rear surface of the semiconductor element and has a recessed section that is recessed toward the one surface, and a part or whole of the rear surface of the semiconductor element is exposed from the sealing member in the recessed section of the sealing member, the side surface includes a high adhesion section that is more adherent to the sealing member than the rear surface, the high adhesion section is a frame-shaped covering section that has a frame shape and covers the side surface of the semiconductor element, the frame-shaped covering section is formed of a resin material that is different from the sealing member, more adherent to the semiconductor element than the sealing member, and more adherent to the sealing member than the semiconductor element, and the frame-shaped covering section has a thickness same as the sealing member and covers a wall surface of the recessed section of the sealing member, and the thickness is a dimension extending along the side surface of the semiconductor element from the front surface toward the rear surface.

4. A semiconductor module comprising:

a semiconductor device including a semiconductor element, a first sealing member, a rewiring layer, and a conductive member, the semiconductor element having a front surface, a rear surface positioned opposite the front surface, and a side surface connecting the front surface and the rear surface, the first sealing member covering the side surface of the semiconductor element, the rewiring layer including an insulating layer, an electrode, and an externally-exposed layer, the insulating layer covering the front surface of the semiconductor element and a part of the first sealing member, the electrode being connected to the semiconductor element, the externally-exposed layer being conductive and covering a portion of the electrode that is exposed from the insulating layer, the conductive member having an upper surface joined to the rear surface of the semiconductor element and a lower surface positioned opposite the upper surface;

a heat dissipation member joined, through a joining material, to a portion of the conductive member that is exposed from the first sealing member;

a lead frame electrically joined to the electrode through the externally-exposed layer or the joining material; and a second sealing member covering the semiconductor device, a part of the heat dissipation member, and a part of the lead frame, wherein the rear surface of the semiconductor element is entirely positioned inside an outline of the conductive member, a plane size of the conductive member along the rear surface of the semiconductor element is larger than the rear surface of the semiconductor element, the conductive member is formed of a metal sintered body, the lower surface of the conductive member is exposed from the sealing member, the conductive member includes a projecting portion that is positioned outside an outline of the semiconductor element, the projecting portion has a plurality of voids of micrometer order or less, the plurality of voids extends at least to an outermost surface of the projecting portion, the projecting portion has a lower density than a remaining portion of the conductive member other than the projecting portion, and the semiconductor device has a fan-out package structure in which an end of the electrode that is exposed from the insulating layer is extended to a position outside the outline of the semiconductor element.

* * * * *